US011430871B2

(12) United States Patent
Costa et al.

(10) Patent No.: US 11,430,871 B2
(45) Date of Patent: Aug. 30, 2022

(54) GALLIUM-NITRIDE-BASED MODULE WITH ENHANCED ELECTRICAL PERFORMANCE AND PROCESS FOR MAKING THE SAME

(71) Applicant: Qorvo US, Inc., Greensboro, NC (US)

(72) Inventors: Julio C. Costa, Oak Ridge, NC (US); Michael Carroll, Jamestown, NC (US)

(73) Assignee: Qorvo US, Inc., Greensboro, NC (US)

(*) Notice: Subject to any disclaimer, the term of this patent is extended or adjusted under 35 U.S.C. 154(b) by 0 days.

(21) Appl. No.: 16/374,125

(22) Filed: Apr. 3, 2019

(65) Prior Publication Data

US 2019/0312110 A1 Oct. 10, 2019

Related U.S. Application Data

(60) Provisional application No. 62/652,380, filed on Apr. 4, 2018.

(51) Int. Cl.
*H01L 29/778* (2006.01)
*H01L 29/20* (2006.01)
*H01L 21/02* (2006.01)

(52) U.S. Cl.
CPC ...... *H01L 29/2003* (2013.01); *H01L 21/0262* (2013.01); *H01L 21/02389* (2013.01); *H01L 21/02458* (2013.01)

(58) Field of Classification Search
CPC ........... H01L 29/2003; H01L 21/02389; H01L 21/02458; H01L 24/19; H01L 21/1565;
(Continued)

(56) References Cited

U.S. PATENT DOCUMENTS 4,093,562 A 6/1978 Kishimoto
4,366,202 A 12/1982 Borovsky
(Continued)

FOREIGN PATENT DOCUMENTS

CN 1696231 A 11/2005
CN 101901953 A 12/2010
(Continued)

OTHER PUBLICATIONS

Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
(Continued)

*Primary Examiner* — Fernando L Toledo
*Assistant Examiner* — Valerie N Newton
(74) *Attorney, Agent, or Firm* — Withrow & Terranova, P.L.L.C.

(57) ABSTRACT

The present disclosure relates to a Gallium-Nitride (GaN) based module, which includes a module substrate, a thinned switch die residing over the module substrate, a first mold compound, and a second mold compound. The thinned switch die includes an electrode region, a number of switch interconnects extending from a bottom surface of the electrode region to the module substrate, an aluminium gallium nitride (AlGaN) barrier layer over a top surface of the electrode region, a GaN buffer layer over the AlGaN barrier layer, and a lateral two-dimensional electron gas (2DEG) layer realized at a heterojunction of the AlGaN barrier layer and the GaN buffer layer. The first mold compound resides over the module substrate, surrounds the thinned switch die, and extends above a top surface of the thinned switch die to form an opening over the top surface of the thinned switch die. The second mold compound fills the opening.

18 Claims, 9 Drawing Sheets

(58) Field of Classification Search
CPC ... H01L 21/568; H01L 24/24; H01L 21/6835; H01L 23/3114
See application file for complete search history.

(56) References Cited

U.S. PATENT DOCUMENTS

| | | | |
|---|---|---|---|
| 5,013,681 A | 5/1991 | Godbey et al. |
| 5,061,663 A | 10/1991 | Bolt et al. |
| 5,069,626 A | 12/1991 | Patterson et al. |
| 5,164,687 A | 11/1992 | Kurian et al. |
| 5,362,972 A | 11/1994 | Yazawa et al. |
| 5,391,257 A | 2/1995 | Sullivan et al. |
| 5,459,368 A | 10/1995 | Onishi et al. |
| 5,646,432 A | 7/1997 | Iwaki et al. |
| 5,648,013 A | 7/1997 | Uchida et al. |
| 5,699,027 A | 12/1997 | Tsuji et al. |
| 5,709,960 A | 1/1998 | Mays et al. |
| 5,729,075 A | 3/1998 | Strain |
| 5,831,369 A | 11/1998 | Fürbacher et al. |
| 5,920,142 A | 7/1999 | Onishi et al. |
| 6,072,557 A | 6/2000 | Kishimoto |
| 6,084,284 A | 7/2000 | Adamic, Jr. |
| 6,154,366 A | 11/2000 | Ma et al. |
| 6,154,372 A | 11/2000 | Kalivas et al. |
| 6,235,554 B1 | 5/2001 | Akram et al. |
| 6,236,061 B1 | 5/2001 | Walpita |
| 6,268,654 B1 | 7/2001 | Glenn et al. |
| 6,271,469 B1 | 8/2001 | Ma et al. |
| 6,377,112 B1 | 4/2002 | Rozsypal |
| 6,423,570 B1 | 7/2002 | Ma et al. |
| 6,426,559 B1 | 7/2002 | Bryan et al. |
| 6,441,498 B1 | 8/2002 | Song |
| 6,446,316 B1 | 9/2002 | Fürbacher et al. |
| 6,578,458 B1 | 6/2003 | Akram et al. |
| 6,649,012 B2 | 11/2003 | Masayuki et al. |
| 6,703,688 B1 | 3/2004 | Fitzergald |
| 6,713,859 B1 | 3/2004 | Ma |
| 6,841,413 B2 | 1/2005 | Liu et al. |
| 6,864,156 B1 | 3/2005 | Conn |
| 6,902,950 B2 | 6/2005 | Ma et al. |
| 6,943,429 B1 | 9/2005 | Glenn et al. |
| 6,964,889 B2 | 11/2005 | Ma et al. |
| 6,992,400 B2 | 1/2006 | Tikka et al. |
| 7,042,072 B1 | 5/2006 | Kim et al. |
| 7,049,692 B2 | 5/2006 | Nishimura et al. |
| 7,064,391 B1 | 6/2006 | Conn |
| 7,109,635 B1 | 9/2006 | McClure et al. |
| 7,183,172 B2 | 2/2007 | Lee et al. |
| 7,190,064 B2 | 3/2007 | Wakabayashi et al. |
| 7,238,560 B2 | 7/2007 | Sheppard et al. |
| 7,279,750 B2 | 10/2007 | Jobetto |
| 7,288,435 B2 | 10/2007 | Aigner et al. |
| 7,307,003 B2 | 12/2007 | Reif et al. |
| 7,393,770 B2 | 7/2008 | Wood et al. |
| 7,402,901 B2 | 7/2008 | Hatano et al. |
| 7,427,824 B2 | 9/2008 | Iwamoto et al. |
| 7,489,032 B2 | 2/2009 | Jobetto |
| 7,596,849 B1 | 10/2009 | Carpenter et al. |
| 7,619,347 B1 | 11/2009 | Bhattacharjee |
| 7,635,636 B2 | 12/2009 | McClure et al. |
| 7,714,535 B2 | 5/2010 | Yamazaki et al. |
| 7,749,882 B2 | 7/2010 | Kweon et al. |
| 7,790,543 B2 | 9/2010 | Abadeer et al. |
| 7,816,231 B2 | 10/2010 | Dyer et al. |
| 7,843,072 B1 | 11/2010 | Park et al. |
| 7,855,101 B2 | 12/2010 | Furman et al. |
| 7,868,419 B1 | 1/2011 | Ken-et al. |
| 7,910,405 B2 | 3/2011 | Okada et al. |
| 7,955,955 B2 | 6/2011 | Lane et al. |
| 7,960,218 B2 | 6/2011 | Ma et al. |
| 8,004,089 B2 | 8/2011 | Jobetto |
| 8,183,151 B2 | 5/2012 | Lake |
| 8,299,633 B2 | 10/2012 | Su |
| 8,420,447 B2 | 4/2013 | Tay et al. |
| 8,503,186 B2 | 8/2013 | Lin et al. |
| 8,563,403 B1 | 10/2013 | Farooq et al. |
| 8,643,148 B2 | 2/2014 | Lin et al. |
| 8,658,475 B1 | 2/2014 | Kerr |
| 8,664,044 B2 | 3/2014 | Jin et al. |
| 8,772,853 B2 | 7/2014 | Hong et al. |
| 8,791,532 B2 | 7/2014 | Graf et al. |
| 8,802,495 B2 | 8/2014 | Kim et al. |
| 8,803,242 B2 | 8/2014 | Marino et al. |
| 8,816,407 B2 | 8/2014 | Kim et al. |
| 8,835,978 B2 | 9/2014 | Mauder et al. |
| 8,906,755 B1 | 12/2014 | Hekmatshoartabari et al. |
| 8,921,990 B2 | 12/2014 | Park et al. |
| 8,927,968 B2 | 1/2015 | Cohen et al. |
| 8,941,248 B2 | 1/2015 | Lin et al. |
| 8,963,321 B2 | 2/2015 | Lenniger et al. |
| 8,983,399 B2 | 3/2015 | Kawamura et al. |
| 9,064,883 B2 | 6/2015 | Meyer et al. |
| 9,165,793 B1 | 10/2015 | Wang et al. |
| 9,214,337 B2 | 12/2015 | Carroll et al. |
| 9,349,700 B2 | 5/2016 | Hsieh et al. |
| 9,368,429 B2 | 6/2016 | Ma et al. |
| 9,406,637 B2 | 8/2016 | Wakisaka et al. |
| 9,461,001 B1 | 10/2016 | Tsai et al. |
| 9,520,428 B2 | 12/2016 | Fujimori |
| 9,530,709 B2 | 12/2016 | Leipold et al. |
| 9,613,831 B2 | 4/2017 | Morris et al. |
| 9,646,856 B2 | 5/2017 | Meyer et al. |
| 9,653,428 B1 | 5/2017 | Hiner et al. |
| 9,786,586 B1 | 10/2017 | Shih |
| 9,812,350 B2 | 11/2017 | Costa |
| 9,824,951 B2 | 11/2017 | Leipold et al. |
| 9,824,974 B2 | 11/2017 | Gao et al. |
| 9,859,254 B1 | 1/2018 | Yu et al. |
| 9,875,971 B2 | 1/2018 | Bhushan et al. |
| 9,941,245 B2 | 4/2018 | Skeete et al. |
| 10,134,837 B1 | 11/2018 | Fanelli et al. |
| 10,727,212 B2 | 7/2020 | Moon et al. |
| 10,784,348 B2 | 9/2020 | Fanelli et al. |
| 2001/0004131 A1 | 6/2001 | Masayuki et al. |
| 2002/0070443 A1 | 6/2002 | Mu et al. |
| 2002/0074641 A1 | 6/2002 | Towle et al. |
| 2002/0127769 A1 | 9/2002 | Ma et al. |
| 2002/0127780 A1 | 9/2002 | Ma et al. |
| 2002/0137263 A1 | 9/2002 | Towle et al. |
| 2002/0185675 A1 | 12/2002 | Furukawa |
| 2003/0207515 A1 | 11/2003 | Tan et al. |
| 2004/0021152 A1 | 2/2004 | Nguyen et al. |
| 2004/0164367 A1 | 8/2004 | Park |
| 2004/0166642 A1 | 8/2004 | Chen et al. |
| 2004/0219765 A1 | 11/2004 | Reif et al. |
| 2005/0037595 A1 | 2/2005 | Nakahata |
| 2005/0077511 A1 | 4/2005 | Fitzergald |
| 2005/0079686 A1 | 4/2005 | Aigner et al. |
| 2005/0212419 A1 | 9/2005 | Vazan et al. |
| 2005/0258447 A1 | 11/2005 | Oi et al. |
| 2006/0057782 A1 | 3/2006 | Gardes et al. |
| 2006/0099781 A1 | 5/2006 | Beaumont et al. |
| 2006/0105496 A1 | 5/2006 | Chen et al. |
| 2006/0108585 A1 | 5/2006 | Gan et al. |
| 2006/0228074 A1 | 10/2006 | Lipson et al. |
| 2006/0261446 A1 | 11/2006 | Wood et al. |
| 2007/0020807 A1 | 1/2007 | Geefay et al. |
| 2007/0045738 A1 | 3/2007 | Jones et al. |
| 2007/0069393 A1 | 3/2007 | Asahi et al. |
| 2007/0075317 A1 | 4/2007 | Kato et al. |
| 2007/0121326 A1 | 5/2007 | Nall et al. |
| 2007/0158746 A1 | 7/2007 | Ohguro |
| 2007/0181992 A1 | 8/2007 | Lake |
| 2007/0190747 A1 | 8/2007 | Humpston et al. |
| 2007/0194342 A1 | 8/2007 | Kinzer |
| 2007/0252481 A1 | 11/2007 | Iwamoto et al. |
| 2007/0276092 A1 | 11/2007 | Kanae et al. |
| 2008/0050852 A1 | 2/2008 | Hwang et al. |
| 2008/0050901 A1 | 2/2008 | Kweon et al. |
| 2008/0164528 A1 | 7/2008 | Cohen et al. |
| 2008/0265978 A1 | 10/2008 | Englekirk |
| 2008/0272497 A1 | 11/2008 | Lake |
| 2008/0277800 A1 | 11/2008 | Hwang et al. |
| 2008/0315372 A1 | 12/2008 | Kuan et al. |

(56) References Cited

U.S. PATENT DOCUMENTS

| | | |
|---|---|---|
| 2009/0008714 A1 | 1/2009 | Chae |
| 2009/0010056 A1 | 1/2009 | Kuo et al. |
| 2009/0014856 A1 | 1/2009 | Knickerbocker |
| 2009/0090979 A1 | 4/2009 | Zhu et al. |
| 2009/0179266 A1 | 7/2009 | Abadeer et al. |
| 2009/0230542 A1 | 9/2009 | Lin et al. |
| 2009/0243097 A1 | 10/2009 | Koroku et al. |
| 2009/0261460 A1 | 10/2009 | Kuan et al. |
| 2009/0302484 A1 | 12/2009 | Lee et al. |
| 2010/0003803 A1 | 1/2010 | Oka et al. |
| 2010/0012354 A1 | 1/2010 | Hedin et al. |
| 2010/0029045 A1 | 2/2010 | Ramanathan et al. |
| 2010/0045145 A1 | 2/2010 | Tsuda |
| 2010/0081232 A1 | 4/2010 | Furman et al. |
| 2010/0081237 A1 | 4/2010 | Wong et al. |
| 2010/0109122 A1 | 5/2010 | Ding et al. |
| 2010/0120204 A1 | 5/2010 | Kunimoto |
| 2010/0127340 A1 | 5/2010 | Sugizaki |
| 2010/0173436 A1 | 7/2010 | Ouellet et al. |
| 2010/0200919 A1 | 8/2010 | Kikuchi |
| 2010/0314637 A1 | 12/2010 | Kim et al. |
| 2011/0003433 A1 | 1/2011 | Harayama et al. |
| 2011/0026232 A1 | 2/2011 | Lin et al. |
| 2011/0036400 A1 | 2/2011 | Murphy et al. |
| 2011/0062549 A1 | 3/2011 | Lin |
| 2011/0068433 A1 | 3/2011 | Kim et al. |
| 2011/0102002 A1 | 5/2011 | Riehl et al. |
| 2011/0171792 A1 | 7/2011 | Chang et al. |
| 2011/0227158 A1 | 9/2011 | Zhu |
| 2011/0272800 A1 | 11/2011 | Chino |
| 2011/0272824 A1 | 11/2011 | Pagaila |
| 2011/0294244 A1 | 12/2011 | Hattori et al. |
| 2012/0003813 A1 | 1/2012 | Chuang et al. |
| 2012/0045871 A1 | 2/2012 | Lee et al. |
| 2012/0068276 A1 | 3/2012 | Lin et al. |
| 2012/0094418 A1 | 4/2012 | Grama et al. |
| 2012/0098074 A1 | 4/2012 | Lin et al. |
| 2012/0104495 A1 | 5/2012 | Zhu et al. |
| 2012/0119346 A1 | 5/2012 | Im et al. |
| 2012/0153393 A1 | 6/2012 | Liang et al. |
| 2012/0168863 A1 | 7/2012 | Zhu et al. |
| 2012/0256260 A1 | 10/2012 | Cheng et al. |
| 2012/0292700 A1 | 11/2012 | Khakifirooz et al. |
| 2012/0299105 A1 | 11/2012 | Cai et al. |
| 2013/0001665 A1 | 1/2013 | Zhu et al. |
| 2013/0015429 A1 | 1/2013 | Hong et al. |
| 2013/0049205 A1 | 2/2013 | Meyer et al. |
| 2013/0099315 A1 | 4/2013 | Zhu et al. |
| 2013/0105966 A1 | 5/2013 | Kelkar et al. |
| 2013/0147009 A1 | 6/2013 | Kim |
| 2013/0155681 A1 | 6/2013 | Nall et al. |
| 2013/0196483 A1 | 8/2013 | Dennard et al. |
| 2013/0200456 A1 | 8/2013 | Zhu et al. |
| 2013/0221493 A1 | 8/2013 | Kim et al. |
| 2013/0241040 A1 | 9/2013 | Tojo et al. |
| 2013/0280826 A1 | 10/2013 | Scanlan et al. |
| 2013/0299871 A1 | 11/2013 | Mauder et al. |
| 2014/0015131 A1 | 1/2014 | Meyer et al. |
| 2014/0035129 A1 | 2/2014 | Stuber et al. |
| 2014/0134803 A1 | 5/2014 | Kelly et al. |
| 2014/0168014 A1 | 6/2014 | Chih et al. |
| 2014/0197530 A1 | 7/2014 | Meyer et al. |
| 2014/0210314 A1 | 7/2014 | Bhattacharjee et al. |
| 2014/0219604 A1 | 8/2014 | Hackler, Sr. et al. |
| 2014/0252566 A1 | 9/2014 | Ken-et al. |
| 2014/0252567 A1 | 9/2014 | Carroll et al. |
| 2014/0264813 A1 | 9/2014 | Lin et al. |
| 2014/0264818 A1 | 9/2014 | Lowe, Jr. et al. |
| 2014/0306324 A1 | 10/2014 | Costa et al. |
| 2014/0323064 A1 | 10/2014 | McCarthy |
| 2014/0327003 A1 | 11/2014 | Fuergut et al. |
| 2014/0327150 A1 | 11/2014 | Jung et al. |
| 2014/0346573 A1 | 11/2014 | Adam et al. |
| 2014/0356602 A1 | 12/2014 | Oh et al. |
| 2015/0015321 A1 | 1/2015 | Dribinsky et al. |
| 2015/0021754 A1 | 1/2015 | Lin et al. |
| 2015/0097302 A1 | 4/2015 | Wakisaka et al. |
| 2015/0108666 A1 | 4/2015 | Engelhardt et al. |
| 2015/0115416 A1 | 4/2015 | Costa et al. |
| 2015/0130045 A1 | 5/2015 | Tseng et al. |
| 2015/0136858 A1 | 5/2015 | Finn et al. |
| 2015/0197419 A1 | 7/2015 | Cheng et al. |
| 2015/0235990 A1 | 8/2015 | Cheng et al. |
| 2015/0235993 A1 | 8/2015 | Cheng et al. |
| 2015/0243881 A1 | 8/2015 | Sankman et al. |
| 2015/0255368 A1 | 9/2015 | Costa |
| 2015/0262844 A1 | 9/2015 | Meyer et al. |
| 2015/0279789 A1 | 10/2015 | Mahajan et al. |
| 2015/0311132 A1 | 10/2015 | Kuo et al. |
| 2015/0364344 A1 | 12/2015 | Yu et al. |
| 2015/0380394 A1 | 12/2015 | Jang et al. |
| 2015/0380523 A1 | 12/2015 | Hekmatshoartabari et al. |
| 2016/0002510 A1 | 1/2016 | Champagne et al. |
| 2016/0056544 A1 | 2/2016 | Garcia et al. |
| 2016/0079137 A1 | 3/2016 | Leipold et al. |
| 2016/0093580 A1 | 3/2016 | Scanlan et al. |
| 2016/0100489 A1 | 4/2016 | Costa et al. |
| 2016/0126111 A1 | 5/2016 | Leipold et al. |
| 2016/0126196 A1 | 5/2016 | Leipold et al. |
| 2016/0133591 A1 | 5/2016 | Hong et al. |
| 2016/0155706 A1 | 6/2016 | Yoneyama et al. |
| 2016/0284568 A1 | 9/2016 | Morris et al. |
| 2016/0284570 A1 | 9/2016 | Morris et al. |
| 2016/0343592 A1 | 11/2016 | Costa et al. |
| 2016/0343604 A1 | 11/2016 | Costa et al. |
| 2016/0347609 A1 | 12/2016 | Yu et al. |
| 2016/0362292 A1 | 12/2016 | Chang |
| 2017/0024503 A1 | 1/2017 | Connelly |
| 2017/0032957 A1 | 2/2017 | Costa et al. |
| 2017/0033026 A1 | 2/2017 | Ho et al. |
| 2017/0053938 A1 | 2/2017 | Whitefield |
| 2017/0062366 A1 | 3/2017 | Enquist |
| 2017/0077028 A1 | 3/2017 | Maxim et al. |
| 2017/0098587 A1 | 4/2017 | Leipold et al. |
| 2017/0190572 A1 | 7/2017 | Pan et al. |
| 2017/0200648 A1 | 7/2017 | Lee et al. |
| 2017/0207350 A1 | 7/2017 | Leipold et al. |
| 2017/0263539 A1 | 9/2017 | Gowda et al. |
| 2017/0271200 A1 | 9/2017 | Costa |
| 2017/0323804 A1 | 11/2017 | Costa et al. |
| 2017/0323860 A1 | 11/2017 | Costa et al. |
| 2017/0334710 A1 | 11/2017 | Costa et al. |
| 2017/0358511 A1 | 12/2017 | Costa et al. |
| 2018/0019184 A1 | 1/2018 | Costa et al. |
| 2018/0019185 A1 | 1/2018 | Costa et al. |
| 2018/0044169 A1 | 2/2018 | Hatcher, Jr. et al. |
| 2018/0044177 A1 | 2/2018 | Vandemeer et al. |
| 2018/0047653 A1 | 2/2018 | Costa et al. |
| 2018/0076174 A1 | 3/2018 | Costa et al. |
| 2018/0138082 A1 | 5/2018 | Costa et al. |
| 2018/0138227 A1 | 5/2018 | Shimotsusa et al. |
| 2018/0145678 A1 | 5/2018 | Maxim et al. |
| 2018/0166358 A1 | 6/2018 | Costa et al. |
| 2018/0269188 A1 | 9/2018 | Yu et al. |
| 2019/0013254 A1 | 1/2019 | Costa et al. |
| 2019/0013255 A1 | 1/2019 | Costa et al. |
| 2019/0043812 A1 | 2/2019 | Leobandung |
| 2019/0074263 A1 | 3/2019 | Costa et al. |
| 2019/0074271 A1 | 3/2019 | Costa et al. |
| 2019/0172826 A1 | 6/2019 | Or-Bach et al. |
| 2019/0172842 A1 | 6/2019 | Whitefield |
| 2019/0189599 A1 | 6/2019 | Baloglu et al. |
| 2019/0229101 A1 | 7/2019 | Lee |
| 2019/0287953 A1 | 9/2019 | Moon et al. |
| 2019/0304910 A1* | 10/2019 | Fillion ............... H01L 23/5286 |
| 2020/0058541 A1 | 2/2020 | Konishi et al. |
| 2020/0235059 A1 | 7/2020 | Cok et al. |
| 2021/0348078 A1 | 11/2021 | Haramoto et al. |

FOREIGN PATENT DOCUMENTS

| | | |
|---|---|---|
| CN | 102956468 A | 3/2013 |
| CN | 103811474 A | 5/2014 |
| CN | 103872012 A | 6/2014 |

(56) References Cited

FOREIGN PATENT DOCUMENTS

| | | |
|---|---|---|
| CN | 106098609 A | 11/2016 |
| EP | 1098386 A1 | 3/2000 |
| EP | 2996143 A1 | 3/2016 |
| JP | S505733 Y1 | 2/1975 |
| JP | S5338954 A | 4/1987 |
| JP | H11-220077 A | 8/1999 |
| JP | 200293957 A | 3/2002 |
| JP | 2002252376 A | 9/2002 |
| JP | 2004273604 A | 9/2004 |
| JP | 2004327557 A | 11/2004 |
| JP | 2006005025 A | 1/2006 |
| JP | 2007227439 A | 9/2007 |
| JP | 2008235490 A | 10/2008 |
| JP | 2008279567 A | 11/2008 |
| JP | 2009026880 A | 2/2009 |
| JP | 2009530823 A | 8/2009 |
| JP | 2009200274 A | 9/2009 |
| JP | 2009302526 A | 12/2009 |
| JP | 2011216780 A | 10/2011 |
| JP | 2011243596 A | 12/2011 |
| JP | 2012129419 A | 7/2012 |
| JP | 2012156251 A | 8/2012 |
| JP | 2013162096 A | 8/2013 |
| JP | 2013222745 A | 10/2013 |
| JP | 2013254918 A | 12/2013 |
| JP | 2014509448 A | 4/2014 |
| TW | 201733056 A | 9/2017 |
| WO | 2007074651 A1 | 7/2007 |
| WO | 2018083961 A1 | 5/2018 |
| WO | WO-2018125242 A1 * | 7/2018 ......... H01L 21/6835 |

OTHER PUBLICATIONS

Anderson, D.R., "Thermal Conductivity of Polymers," Sandia Corporation, Mar. 8, 1966, pp. 677-690.

Author Unknown, "96% Alumina, thick-film, as fired," MatWeb, Date Unknown, date accessed Apr. 6, 2016, 2 pages, http://www.matweb.com/search/DataSheet.aspx?MatGUID=3996a734395a4870a9739076918c4297&ckck=1.

Author Unknown, "CoolPoly D5108 Thermally Conductive Polyphenylene Sulfide (PPS)," Cool Polymers, Inc., Aug. 8, 2007, 2 pages.

Author Unknown, "CoolPoly D5506 Thermally Conductive Liquid Crystalline Polymer (LCP)," Cool Polymers, Inc., Dec. 12, 2013, 2 pages.

Author Unknown, "CoolPoly D-Series—Thermally Conductive Dielectric Plastics," Cool Polymers, Retrieved Jun. 24, 2013, http://coolpolymers.com/dseries.asp, 1 page.

Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.

Author Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.

Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.

Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.

Author Unknown, "CoolPoly Selection Tool," Cool Polymers, Inc., 2006, 1 page, http://www.coolpolymers.com/select.asp?Application=Substrates+%26+Electcronic_Packaging.

Author Unknown, "CoolPoly Thermally Conductive Plastics for Dielectric Heat Plates," Cool Polymers, Inc., 2006, 2 pages, http://www.coolpolymers.com/heatplate.asp.

Author Unknown, "CoolPoly Thermally Conductive Plastics for Substrates and Electronic Packaging," Cool Polymers, Inc., 2005, 1 page.

Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.

Author Unknown, "Fully Sintered Ferrite Powders," Powder Processing and Technology, LLC, Date Unknown, 1 page.

Author Unknown, "Heat Transfer," Cool Polymers, Inc., 2006, http://www.coolpolymers.com/heattrans.html, 2 pages.

Author Unknown, "Hysol UF3808," Henkel Corporation, Technical Data Sheet, May 2013, 2 pages.

Author Unknown, "PolyOne Therma-Tech™ LC-5000C TC LCP," MatWeb, Date Unknown, date accessed Apr. 6, 2016, 2 pages, http://www.matweb.com/search/datasheettext.aspx?matguid=89754e8bb26148d083c5ebb05a0cbff1.

Author Unknown, "Sapphire Substrate," from CRC Handbook of Chemistry and Physics, Date Unknown, 1 page.

Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.

Author Unknown, "Thermal Properties of Solids," PowerPoint Presentation, No Date, 28 slides, http://www.phys.huji.ac.il/Phys_Hug/Lectures/77602/PHONONS_2_thermal.pdf.

Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.

Author Unknown, "The Technology: AKHAN's Approach and Solution: The Miraj Diamond™ Platform," 2015, accessed Oct. 9, 2016, http://www.akhansemi.com/technology.html#the-miraj-diamond-plafform, 5 pages.

Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.

Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.

Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.

Colinge, J.P., et al., "A Low-Voltage, Low-Power Microwave SOI MOSFET," Proceedings of 1996 IEEE International SOI Conference, Oct. 1996, pp. 128-129.

Costa, J. et al., "Integrated MEMS Switch Technology on SOI-CMOS," Proceedings of Hilton Head Workshop: A Solid-State Sensors, Actuators and Microsystems Workshop, Jun. 1-5, 2008, Hilton Head Island, SC, IEEE, pp. 900-903.

Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.

Costa, J., "RFCMOS SOI Technology for 4G Reconfigurable RF Solutions," Session WEC1-2, Proceedings of the 2013 IEEE International Microwave Symposium, 4 pages.

Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.

Finne, R. M. et al., "A Water-Amine-Complexing Agent System for Etching Silicon," Journal of The Electrochemical Society, vol. 114, No. 9, Sep. 1967, pp. 965-970.

Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.

Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.

Joshi, V. et al., "MEMS Solutions in RF Applications," 2013 IEEE SOI-3D-Subthreshold Microelectronics Technology Unified Conference (S3S), Oct. 2013, IEEE, 2 pages.

(56) References Cited

OTHER PUBLICATIONS

Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.
Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lederer, Dimitri et al., "Substrate loss mechanisms for microstrip and CPW transmission lines on lossy silicon wafers," Solid-State Electronics, vol. 47, No. 11, Nov. 2003, pp. 1927-1936.
Lee, Kwang Hong et al., "Integration of III—V materials and Si-CMOS through double layer transfer process," Japanese Journal of Applied Physics, vol. 54, Jan. 2015, pp. 030209-1 to 030209-5.
_EE, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.
Lu, J.Q. et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, Ye.P., et al., "Electrical and Thermal Conductivity of Polymers Filled with Metal Powders," European Polymer Journal, vol. 38, 2002, pp. 1887-1897.
Mansour, Raafat R., "RF MEMS-CMOS Device Integration," IEEE Microwave Magazine, vol. 14, No. 1, Jan. 2013, pp. 39-56.
Mazuré, C. et al., "Advanced SOI Substrate Manufacturing," 2004 IEEE International Conference on Integrated Circuit Design and Technology, 2004, IEEE, pp. 105-111.
Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, 031101 (2006), 28 pages.
Parthasarathy, S., et al., "RF SOI Switch FET Design and Modeling Tradeoffs for GSM Applications," 2010 23rd International Conference on VLSI Design, (VLSID '10), Jan. 2010, pp. 194-199.
Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Raskin, Jean-Pierre et al., "Substrate Crosstalk Reduction Using SOI Technology," IEEE Transactions on Electron Devices, vol. 44, No. 12, Dec. 1997, pp. 2252-2261.
Rong, B., et al., "Surface-Passivated High-Resistivity Silicon Substrates for RFICs," IEEE Electron Device Letters, vol. 25, No. 4, Apr. 2004, pp. 176-178.
Sherman, Lilli M., "Plastics that Conduct Heat," Plastics Technology Online, Jun. 2001, Retrieved May 17, 2016, http://www.ptonline.com/articles/plastics-that-conduct-heat, Gardner Business Media, Inc., 5 pages.
Tombak, A., et al., "High-Efficiency Cellular Power Amplifiers Based on a Modified LDMOS Process on Bulk Silicon and Silicon-on-Insulator Substrates with Integrated Power Management Circuitry," IEEE Transactions on Microwave Theory and Techniques, vol. 60, No. 6, Jun. 2012, pp. 1862-1869.
Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.
Non-Final Office Action for U.S. Appl. No. 13/852,648, dated Jul. 18, 2013, 20 pages.
Final Office Action for U.S. Appl. No. 13/852,648, dated Nov. 26, 2013, 21 pages.
Applicant-Initiated Interview Summary for U.S. Appl. No. 13/852,648, dated Jan. 27, 2014, 4 pages.
Advisory Action for U.S. Appl. No. 13/852,648, dated Mar. 7, 2014, 4 pages.
Notice of Allowance for U.S. Appl. No. 13/852,648, dated Jun. 16, 2014, 9 pages.
Notice of Allowance for U.S. Appl. No. 13/852,648, dated Sep. 26, 2014, 8 pages.
Notice of Allowance for U.S. Appl. No. 13/852,648, dated Jan. 22, 2015, 8 pages.
Non-Final Office Action for U.S. Appl. No. 13/852,648, dated Jun. 24, 2015, 20 pages.
Final Office Action for U.S. Appl. No. 13/852,648, dated Oct. 22, 2015, 20 pages.
Non-Final Office Action for U.S. Appl. No. 13/852,648, dated Feb. 19, 2016, 12 pages.
Final Office Action for U.S. Appl. No. 13/852,648, dated Jul. 20, 2016, 14 pages.
Non-Final Office Action for U.S. Appl. No. 14/315,765, dated Jan. 2, 2015, 6 pages.
Final Office Action for U.S. Appl. No. 14/315,765, dated May 11, 2015, 17 pages.
Advisory Action for U.S. Appl. No. 14/315,765, dated Jul. 22, 2015, 3 pages.
Non-Final Office Action for U.S. Appl. No. 14/260,909, dated Mar. 20, 2015, 20 pages.
Final Office Action for U.S. Appl. No. 14/260,909, dated Aug. 12, 2015, 18 pages.
Non-Final Office Action for U.S. Appl. No. 14/261,029, dated Dec. 5, 2014, 15 pages.
Notice of Allowance for U.S. Appl. No. 14/261,029, dated Apr. 27, 2015, 10 pages.
Corrected Notice of Allowability for U.S. Appl. No. 14/261,029, dated Nov. 17, 2015, 5 pages.
Non-Final Office Action for U.S. Appl. No. 14/529,870, dated Feb. 12, 2016, 14 pages.
Notice of Allowance for U.S. Appl. No. 14/529,870, dated Jul. 15, 2016, 8 pages.
Non-Final Office Action for U.S. Appl. No. 15/293,947, dated Apr. 7, 2017, 12 pages.
Notice of Allowance for U.S. Appl. No. 15/293,947, dated Aug. 14, 2017, 7 pages.
Non-Final Office Action for U.S. Appl. No. 14/715,830, dated Apr. 13, 2016, 16 pages.
Final Office Action for U.S. Appl. No. 14/715,830, dated Sep. 6, 2016, 13 pages.
Advisory Action for U.S. Appl. No. 14/715,830, dated Oct. 31, 2016, 6 pages.
Notice of Allowance for U.S. Appl. No. 14/715,830, dated Feb. 10, 2017, 8 pages.
Notice of Allowance for U.S. Appl. No. 14/715,830, dated Mar. 2, 2017, 8 pages.
Non-Final Office Action for U.S. Appl. No. 14/851,652, dated Oct. 7, 2016, 10 pages.
Notice of Allowance for U.S. Appl. No. 14/851,652, dated Apr. 11, 2017, 9 pages.
Corrected Notice of Allowance for U.S. Appl. No. 14/851,652, dated Jul. 24, 2017, 6 pages.
Corrected Notice of Allowance for U.S. Appl. No. 14/851,652, dated Sep. 6, 2017, 5 pages.
Notice of Allowance for U.S. Appl. No. 14/959,129, dated Oct. 11, 2016, 8 pages.
Non-Final Office Action for U.S. Appl. No. 15/173,037, dated Jan. 10, 2017, 8 pages.
Final Office Action for U.S. Appl. No. 15/173,037, dated May 2, 2017, 13 pages.
Advisory Action for U.S. Appl. No. 15/173,037, dated Jul. 20, 2017, 3 pages.
Notice of Allowance for U.S. Appl. No. 15/173,037, dated Aug. 9, 2017, 7 pages.

(56) References Cited

OTHER PUBLICATIONS

Non-Final Office Action for U.S. Appl. No. 15/085,185, dated Feb. 15, 2017, 10 pages.
Non-Final Office Action for U.S. Appl. No. 15/085,185, dated Jun. 6, 2017, 5 pages.
Non-Final Office Action for U.S. Appl. No. 15/229,780, dated Jun. 30, 2017, 12 pages.
Non-Final Office Action for U.S. Appl. No. 15/262,457, dated Aug. 7, 2017, 10 pages.
Notice of Allowance for U.S. Appl. No. 15/408,560, dated Sep. 25, 2017, 8 pages.
Notice of Allowance for U.S. Appl. No. 15/287,202, dated Aug. 25, 2017, 11 pages.
Non-Final Office Action for U.S. Appl. No. 15/353,346, dated May 23, 2017, 15 pages.
Notice of Allowance for U.S. Appl. No. 151353,346, dated Sep. 25, 2017, 9 pages.
Notice of Allowance for U.S. Appl. No. 15/287,273, dated Jun. 30, 2017, 8 pages.
Corrected Notice of Allowability for U.S. Appl. No. 15/287,273, dated Jul. 21, 2017, 5 pages.
Supplemental Notice of Allowability for U.S. Appl. No. 15/287,273, dated Sep. 7, 2017, 5 pages.
Extended European Search Report for European Patent Application No. 15184861.1, dated Jan. 25, 2016, 6 pages.
Office Action of the Intellectual Property Office for Taiwanese Patent Application No. 104130224, dated Jun. 15, 2016, 9 pages.
Non-Final Office Action for U.S. Appl. No. 14/885,202, dated Apr. 14, 2016, 5 pages.
Final Office Action for U.S. Appl. No. 14/885,202, dated Sep. 27, 2016, 7 pages.
Advisory Action for U.S. Appl. No. 14/885,202, dated Nov. 29, 2016, 3 pages.
Notice of Allowance for U.S. Appl. No. 14/885,202, dated Jan. 27, 2017, 7 pages.
Notice of Allowance for U.S. Appl. No. 14/885,202, dated Jul. 24, 2017, 8 pages.
Notice of Allowance for U.S. Appl. No. 14/885,243, dated Aug. 31, 2016, 8 pages.
Non-Final Office Action for U.S. Appl. No. 12/906,689, dated May 27, 2011, 13 pages.
Non-Final Office Action for U.S. Appl. No. 12/906,689, dated Nov. 4, 2011, 20 pages.
Search Report for Japanese Patent Application No. 2011-229152, dated Feb. 22, 2013, 58 pages.
Office Action for Japanese Patent Application No. 2011-229152, dated May 10, 2013, 7 pages.
Final Rejection for Japanese Patent Application No. 2011-229152, dated Oct. 25, 2013, 2 pages.
International Search Report and Written Opinion for PCT/US2016/045809, dated Oct. 7, 2016, 11 pages.
Non-Final Office Action for U.S. Appl. No. 15/652,867, dated Oct. 10, 2017, 5 pages.
Bernheim et al., "Chapter 9: Lamination," Tools and Manufacturing Engineers Handbook (book), Apr. 1, 1996, Society of Manufacturing Engineers, p. 9-1.
Fillion R. et al., "Development of a Plastic Encapsulated Multichip Technology for High Volume, Low Cost Commercial Electronics," Electronic Components and Technology Conference, vol. 1, May 1994, IEEE, 5 pages.
Hienawy, Mahmoud AL et al., "New Thermoplastic Polymer Substrate for Microstrip Antennas at 60 GHz," German Microwave Conference, Mar. 15-17, 2010, Berlin, Germany, IEEE, pp. 5-8.
International Search Report and Written Opinion for PCT/US2017/046744, dated Nov. 27, 2017, 17 pages.
International Search Report and Written Opinion for PCT/US2017/046758, dated Nov. 16, 2017, 19 pages.
International Search Report and Written Opinion for PCT/US2017/046779, dated Nov. 29, 2017, 17 pages.
Non-Final Office Action for U.S. Appl. No. 15/616,109, dated Oct. 23, 2017, 16 pages.
Corrected Notice of Allowability for U.S. Appl. No. 14/851,652, dated Oct. 20, 2017, 5 pages.
Final Office Action for U.S. Appl. No. 15/262,457, dated Dec. 19, 2017, 12 pages.
Supplemental Notice of Allowability and Applicant-Initiated Interview Summary for U.S. Appl. No. 15/287,273, dated Oct. 18, 2017, 6 pages.
Supplemental Notice of Allowability for U.S. Appl. No. 15/287,273, dated Nov. 2, 2017, 5 pages.
Non-Final Office Action for U.S. Appl. No. 15/491,064, dated Jan. 2, 2018, 9 pages.
Notice of Allowance for U.S. Appl. No. 14/872,910, dated Nov. 17, 2017, 11 pages.
Notice of Allowance for U.S. Appl. No. 15/648,082, dated Nov. 29, 2017, 8 pages.
Non-Final Office Action for U.S. Appl. No. 15/652,826, dated Nov. 3, 2017, 5 pages.
Notice of Allowance for U.S. Appl. No. 15/229,780, dated Oct. 3, 2017, 7 pages.
Supplemental Notice of Allowability for U.S. Appl. No. 15/287,273, dated Jan. 17, 2018, 5 pages.
Notice of Allowance for U.S. Appl. No. 15/498,040, dated Feb. 20, 2018, 8 pages.
Non-Final Office Action for U.S. Appl. No. 15/387,855, dated Jan. 16, 2018, 7 pages.
Non-Final Office Action for U.S. Appl. No. 15/795,915, dated Feb. 23, 2018, 6 pages.
International Preliminary Report on Patentability for PCT/US2016/045809, dated Feb. 22, 2018, 8 pages.
Advisory Action and Applicant-Initiated Interview Summary for U.S. Appl. No. 15/262,457, dated Feb. 28, 2018, 5 pages.
Supplemental Notice of Allowability for U.S. Appl. No. 15/287,273, dated Feb. 23, 2018, 5 pages.
Non-Final Office Action for U.S. Appl. No. 15/676,415, dated Mar. 27, 2018, 14 page.
Non-Final Office Action for U.S. Appl. No. 15/676,621, dated Mar. 26, 2018, 16 pages.
Notice of Allowance for U.S. Appl. No. 15/795,915, dated Jun. 15, 2018, 7 pages.
Final Office Action for U.S. Appl. No. 15/387,855, dated May 24, 2018, 9 pages.
Non-Final Office Action for U.S. Appl. No. 15/262,457, dated Apr. 19, 2018, 10 pages.
Notice of Allowance for U.S. Appl. No. 15/491,064, dated Apr. 30, 2018, 9 pages.
Non-Final Office Action for U.S. Appl. No. 15/601,858, dated Jun. 26, 2018, 12 pages.
Notice of Allowance for U.S. Appl. No. 15/616,109, dated Jul. 2, 2018, 7 pages.
Notice of Allowance for U.S. Appl. No. 15/676,621, dated Jun. 5, 2018, 8 pages.
Non-Final Office Action for U.S. Appl. No. 15/676,693, dated May 3, 2018, 14 pages.
Notice of Allowance for U.S. Appl. No. 15/789,107, dated May 18, 2018, 8 pages.
Final Office Action for U.S. Appl. No. 15/616,109, dated Apr. 19, 2018, 18 pages.
Notice of Allowance for U.S. Appl. No. 15/676,693, dated Jul. 20, 2018, 8 pages.
Notice of Allowance for U.S. Appl. No. 15/695,629, dated Jul. 11, 2018, 12 pages.
Notice of Allowance for U.S. Appl. No. 15/387,855, dated Aug. 10, 2018, 7 pages.
Notice of Allowance for U.S. Appl. No. 15/914,538, dated Aug. 1, 2018, 9 pages.
Notice of Allowance and Applicant-Initiated Interview Summary for U.S. Appl. No. 15/262,457, dated Sep. 28, 2018, 16 pages.
Corrected Notice of Allowance for U.S. Appl. No. 15/676,693, dated Aug. 29, 2018, 5 pages.
Final Office Action for U.S. Appl. No. 15/601,858, dated Nov. 26, 2018, 16 pages.

(56) References Cited

OTHER PUBLICATIONS

Non-Final Office Action for U.S. Appl. No. 15/945,418, dated Nov. 1, 2018, 13 pages.
First Office Action for Chinese Patent Application No. 201510746323.X, dated Nov. 2, 2018, 12 pages.
Advisory Action for U.S. Appl. No. 15/601,858, dated Jan. 22, 2019, 3 pages.
Notice of Allowance for U.S. Appl. No. 16/038,879, dated Jan. 9, 2019, 8 pages.
Notice of Allowance for U.S. Appl. No. 16/004,961, dated Jan. 11, 2019, 8 pages.
International Preliminary Report on Patentability for PCT/US2017/046744, dated Feb. 21, 2019, 11 pages.
International Preliminary Report on Patentability for PCT/US2017/046758, dated Feb. 21, 2019, 11 pages.
International Preliminary Report on Patentability for PCT/US2017/046779, dated Feb. 21, 2019, 11 pages.
Non-Final Office Action for U.S. Appl. No. 15/992,613, dated Feb. 27, 2019, 15 pages.
Non-Final Office Action for U.S. Appl. No. 15/695,579, dated Jan. 28, 2019, 8 pages.
Notice of Allowance for U.S. Appl. No. 15/992,639, dated May 9, 2019, 7 pages.
Notice of Allowance for U.S. Appl. No. 15/695,579, dated Mar. 20, 2019, 8 pages.
Notice of Allowance for U.S. Appl. No. 16/004,961, dated May 13, 2019, 8 pages.
Non-Final Office Action for U.S. Appl. No. 15/601,858, dated Apr. 17, 2019, 9 pages.
Tsai, Chun-Lin, et al., "Smart GaN platform; Performance & Challenges," IEEE International Electron Devices Meeting, 2017, 4 pages.
Tsai, Szu-Ping., et al., "Performance Enhancement of Flip-Chip Packaged AlGAaN/GaN HEMTs by Strain Engineering Design," IEEE Transcations on Electron Devices, vol. 63, Issue 10, Oct. 2016, pp. 3876-3881.
Final Office Action for U.S. Appl. No. 15/992,613, dated May 24, 2019, 11 pages.
Non-Final Office Action for U.S. Appl. No. 15/873,152, dated May 24, 2019, 11 pages.
Notice of Allowance for U.S. Appl. No. 16/168,327, dated Jun. 28, 2019, 7 pages.
Lin, Yueh, Chin, et al., "Enhancement-Mode GaN MIS-HEMTs With LaHfOx Gate Insulator for Power Application," IEEE Electronic Device Letters, vol. 38, Issue 8, 2017, 4 pages.
Shukla, Shishir, et al., "GaN-on-Si Switched Mode RF Power Amplifiers for Non-Constant Envelope Signals," IEEE Topical Conference on RF/Microwave Power Amplifiers for Radio and Wireless Applications, 2017, pp. 88-91.
International Search Report and Written Opinion for International Patent Application No. PCT/US19/25591, dated Jun. 21, 2019, 7 pages.
Notice of Reasons for Refusal for Japanese Patent Application No. 2015-180657, dated Jul. 9, 2019, 4 pages.
Notice of Allowance for U.S. Appl.n No. 15/601,858, dated Aug. 16, 2019, 8 pages.
Advisory Action for U.S. Appl. No. 15/992,613, dated Jul. 29, 2019, 3 pages.
Final Office Action for U.S. Appl. No. 15/873,152, dated Aug. 8, 2019, 13 pages.
Notice of Allowance for U.S. Appl. No. 15/975,230, dated Jul. 22, 2019, 7 pages.
Notice of Allowance for U.S. Appl. No. 16/004,961, dated Aug. 28, 2019, 8 pages.
International Search Report and Written Opinion for International Patent Application No. PCT/US2019/034645, dated Sep. 19, 2019, 14 pages.
International Search Report and Written Opinion for International Patent Application No. PCT/US2019/034699, dated Oct. 29, 2019, 13 pages.
Notice of Allowance for U.S. Appl. No. 15/992,613, dated Sep. 23, 2019, 7 pages.
Non-Final Office Action for U.S. Appl. No. 16/204,214, dated Oct. 9, 2019, 15 pages.
Non-Final Office Action for U.S. Appl. No. 15/816,637, dated Oct. 31, 2019, 10 pages.
Advisory Action for U.S. Appl. No. 15/873,152, dated Oct. 11, 2019, 3 pages.
Office Action for Japanese Patent Application No. 2018-526613, dated Nov. 5, 2019, 8 pages.
Notice of Allowance for U.S. Appl. No. 15/873,152, dated Dec. 10, 2019, 9 pages.
Non-Final Office Action for U.S. Appl. No. 16/527,702, dated Jan. 10, 2020, 10 pages.
Fiorenza, et al., "Detailed Simulation Study of a Reverse Embedded-SiGE Strained-Silicon MOSFET," IEEE Transactions on Electron Devices, vol. 55, Issue 2, Feb. 2008, pp. 640-648.
Fiorenza, et al., "Systematic study of thick strained silicon NMOSFETs for digital applications," International SiGE Technology and Device Meeting, May 2006, IEEE, 2 pages.
Huang, et al., "Carrier Mobility Enhancement in Strained Si-on-Insulator Fabricated by Wafer Bonding," Symposium on VLSI Technology, Digest of Technical Papers, 2001, pp. 57-58.
Nan, et al., "Effect of Germanium content on mobility enhancement for strained silicon FET," Student Conference on Research and Development, Dec. 2017, IEEE, pp. 154-157.
Sugii, Nobuyuki, et al., "Performance Enhancement of Strained-Si MOSFETs Fabricated on a Chemical-Mechanical-Polished SiGE Substrate," IEEE Transactions on Electron Devices, vol. 49, Issue 12, Dec. 2002, pp. 2237-2243.
Yin, IHaizhou, et al., "Fully-depleted Strained-Si on Insulator NMOSFETs without Relaxed SiGe Buffers," International Electron Devices Meeting, Dec. 2003, San Francisco, California, IEEE, 4 pages.
Dhar, S. et al., "Electron Mobility Model for Strained-Si Devices," IEEE Transactions on Electron Devices, vol. 52, No. 4, Apr. 2005, IEEE, pp. 527-533.
Notice of Allowance for U.S. Appl. No. 16/038,879, dated Apr. 15, 2020, 9 pages.
Notice of Allowance for U.S. Appl. No. 15/816,637, dated Apr. 2, 2020, 8 pages.
Corrected Notice of Allowability for U.S. Appl. No. 15/695,579, dated Feb. 5, 2020, 5 pages.
Corrected Notice of Allowability for U.S. Appl. No. 15/695,579, dated Apr. 1, 2020, 4 pages.
Notice of Allowance for U.S. Appl. No. 16/527,702, dated Apr. 9, 2020, 8 pages.
Final Office Action for U.S. Appl. No. 16/204,214, dated Mar. 6, 2020, 14 pages.
Advisory Action for U.S. Appl. No. 16/204,214, dated Apr. 15, 2020, 3 pages.
Decision of Rejection for Japanese Patent Application No. 2015-180657, dated Mar. 17, 2020, 4 pages.
Intention to Grant for European Patent Application No. 17757646.9, dated Feb. 27, 2020, 55 pages.
International Search Report and Written Opinion for International Patent Application No. PCT/US2019/063460, dated Feb. 25, 2020, 14 pages.
International Search Report and Written Opinion for International Patent Application No. PCT/US2019/055317, dated Feb. 6, 2020, 17 pages.
International Search Report and Written Opinion for International Patent Application No. PCT/US2019/055321, dated Jan. 27, 2020, 23 pages.
Notice of Allowance for U.S. Appl. No. 16/703,251, dated Aug. 27, 2020, 8 pages.
Notice of Allowance for U.S. Appl. No. 16/454,687, dated Aug. 14, 2020, 7 pages.
Final Office Action for U.S. Appl. No. 16/454,809, dated Aug. 21, 2020, 12 pages.
Advisory Action for U.S. Appl. No. 16/454,809, dated Oct. 23, 2020, 3 pages.

(56) References Cited

OTHER PUBLICATIONS

Quayle Action for U.S. Appl. No. 16/703,251, dated Jun. 26, 2020, 5 pages.
Notice of Allowance for U.S. Appl. No. 15/873,152, dated May 11, 2020, 8 pages.
Corrected Notice of Allowability for U.S. Appl. No. 15/695,579, dated May 20, 2020, 4 pages.
Notice of Allowability for U.S. Appl. No. 15/695,579, dated Jun. 25, 2020, 4 pages.
Notice of Allowance for U.S. Appl. No. 16/004,961, dated Apr. 30, 2020, 8 pages.
Notice of Allowance for U.S. Appl. No. 16/368,210, dated Jun. 17, 2020, 10 pages.
Non-Final Office Action for U.S. Appl. No. 16/390,496, dated Jul. 10, 2020, 17 pages.
Non-Final Office Action for U.S. Appl. No. 16/204,214, dated May 19, 2020, 15 pages.
Non-Final Office Action for U.S. Appl. No. 16/454,687, dated May 15, 2020, 14 pages.
Non-Final Office Action for U.S. Appl. No. 16/454,809, dated May 15, 2020, 12 pages.
Decision to Grant for Japanese Patent Application No. 2018-526613, dated Aug. 17, 2020, 5 pages.
International Preliminary Report on Patentability for International Patent Application No. PCT/US2019/025591, dated Oct. 15, 2020, 6 pages.
Welser, J. et al., "Electron Mobility Enhancement in Strained-Si N-Type Metal-Oxide-Semiconductor Field-Effect Transistors," IEEE Electron Device Letters, vol. 15, No. 3, Mar. 1994, IEEE, pp. 100-102.
Examination Report for European Patent Application No. 16751791.1, dated Apr. 30, 2020, 15 pages.
Notification of Reasons for Refusal for Japanese Patent Application No. 2018-526613, dated May 11, 2020, 6 pages.
Examination Report for Singapore Patent Application No. 11201901193U, dated May 26, 2020, 6 pages.
International Search Report and Written Opinion for International Patent Application No. PCT/US2020/014662, dated May 7, 2020, 18 pages.
International Search Report and Written Opinion for International Patent Application No. PCT/US2020/014665, dated May 13, 2020, 17 pages.
International Search Report and Written Opinion for International Patent Application No. PCT/US2020/014666, dated Jun. 4, 2020, 18 pages.
International Search Report and Written Opinion for International Patent Application No. PCT/US2020/014667, dated May 18, 2020, 14 pages.
International Search Report and Written Opinion for International Patent Application No. PCT/US2020/014669, dated Jun. 4, 2020, 15 pages.
Notice of Allowance for U.S. Appl. No. 16/527,702, dated Nov. 13, 2020, 8 pages.
Final Office Action for U.S. Appl. No. 16/390,496, dated Dec. 24, 2020, 21 pages.
Non-Final Office Action for U.S. Appl. No. 16/426,527, dated Nov. 20, 2020, 7 pages.
Final Office Action for U.S. Appl. No. 16/204,214, dated Nov. 30, 2020, 15 pages.
Notice of Allowance for U.S. Appl. No. 16/454,809, dated Nov. 25, 2020, 8 pages.
Non-Final Office Action for U.S. Appl. No. 16/427,019, dated Nov. 19, 2020, 19 pages.
First Office Action for Chinese Patent Application No. 201680058198.6, dated Dec. 29, 2020, 14 pages.
International Preliminary Report on Patentability for International Patent Application No. PCT/US2019/034645, dated Jan. 14, 2021, 9 pages.
Advisory Action for U.S. Appl. No. 16/390,496, dated Mar. 1, 2021, 3 pages.
Notice of Allowance for U.S. Appl. No. 16/204,214, dated Feb. 17, 2021, 11 pages.
Non-Final Office Action for U.S. Appl. No. 16/678,573, dated Feb. 19, 2021, 11 pages.
Non-Final Office Action for U.S. Appl. No. 16/678,602, dated Feb. 19, 2021, 10 pages.
Notice of Allowance for U.S. Appl. No. 16/390,496, dated Apr. 5, 2021, 7 pages.
Non-Final Office Action for U.S. Appl. No. 16/678,551, dated Apr. 7, 2021, 9 pages.
Supplementary Examination Report for Singapore Patent Application No. 11201901194S, dated Mar. 10, 2021, 3 pages.
International Preliminary Report on Patentability for International Patent Application No. PCT/US2019/055317, dated Apr. 22, 2021, 11 pages.
International Preliminary Report on Patentability for International Patent Application No. PCT/US2019/055321, dated Apr. 22, 2021, 14 pages.
Office Action for Taiwanese Patent Application No. 108140788, dated Mar. 25, 2021, 18 pages.
International Preliminary Report on Patentability for International Patent Application No. PCT/US2019/063460, dated Jun. 10, 2021, 9 pages.
Notice of Allowance for U.S. Appl. No. 16/426,527, dated May 14, 2021, 9 pages.
Final Office Action for U.S. Appl. No. 16/427,019, dated May 21, 2021, 16 pages.
Applicant-Initiated Interview Summary for U.S. Appl. No. 16/678,573, dated May 7, 2021, 2 pages.
Final Office Action for U.S. Appl. No. 16/678,602, dated Jun. 1, 2021, 9 pages.
Notice of Reason for Refusal for Japanese Patent Application No. 2020119130, dated Jun. 29, 2021, 4 pages.
Notice of Reasons for Rejection for Japanese Patent Application No. 2019507765, dated Jun. 28, 2021, 4 pages.
Search Report for Japanese Patent Application No. 2019507768, dated Jul. 15, 2021, 42 pages.
Notice of Reasons for Refusal for Japanese Patent Application No. 2019507768, dated Jul. 26, 2021, 4 pages.
Reasons for Rejection for Japanese Patent Application No. 2019507767, dated Jun. 25, 2021, 5 pages.
Final Office Action and Examiner-Initiated Interview Summary for U.S. Appl. No. 16/678,551, dated Jun. 28, 2021, 9 pages.
Final Office Action and Examiner-Initiated Interview Summary for U.S. Appl. No. 16/678,573, dated Jun. 28, 2021, 10 pages.
Notice of Allowance for U.S. Appl. No. 16/678,619, dated Jul. 8, 2021, 10 pages.
Corrected Notice of Allowability for U.S. Appl. No. 16/426,527, dated Aug. 18, 2021, 4 pages.
Advisory Action for U.S. Appl. No. 16/427,019, dated Aug. 2, 2021, 3 pages.
Advisory Action and Examiner-Initiated Interview Summary for U.S. Appl. No. 16/678,551, dated Sep. 13, 2021, 3 pages.
Advisory Action and Examiner-Initiated Interview Summary for U.S. Appl. No. 16/678,573, dated Sep. 10, 2021, 3 pages.
Non-Final Office Action for U.S. Appl. No. 16/678,586, dated Aug. 12, 2021, 16 pages.
Notice of Allowance and Examiner-Initiated Interview Summary for U.S. Appl. No. 16/678,602, dated Aug. 12, 2021, 11 pages.
Corrected Notice of Allowability for U.S. Appl. No. 16/678,602, dated Aug. 26, 2021, 4 pages.
International Preliminary Report on Patentability for International Patent Application No. PCT/US2019/034699, dated Aug. 5, 2021, 9 pages.
International Preliminary Report on Patentability for International Patent Application No. PCT/US2020/014662, dated Aug. 5, 2021, 11 pages.
International Preliminary Report on Patentability for International Patent Application No. PCT/US2020/014665, dated Aug. 5, 2021, 10 pages.
International Preliminary Report on Patentability for International Patent Application No. PCT/US2020/014666, dated Aug. 5, 2021, 11 pages.

(56) References Cited

OTHER PUBLICATIONS

International Preliminary Report on Patentability for International Patent Application No. PCT/US2020/014667, dated Aug. 5, 2021, 8 pages.
International Preliminary Report on Patentability for International Patent Application No. PCT/US2020/014669, dated Aug. 5, 2021, 9 pages.
Decision to Grant for Japanese Patent Application No. 2020119130, dated Sep. 7, 2021, 4 pages.
Notice of Allowance and Examiner-Initiated Interview Summary for U.S. Appl. No. 16/678,551, dated Oct. 21, 2021, 8 pages.
Notice of Allowance and Examiner-Initiated Interview Summary for U.S. Appl. No. 16/678,573, dated Oct. 21, 2021, 7 pages.
Second Office Action for Chinese Patent Application No. 201680058198.6, dated Sep. 8, 2021, 8 pages.
Borel, S. et al., "Control of Selectivity between SiGe and Si in Isotopic Etching Processes," Japanese Journal of Applied Physics, vol. 43, No. 6B, 2004, pp. 3964-3966.
Decision of Rejection for Chinese Patent Application No. 201680058198.6, dated Nov. 12, 2021, 6 pages.
Examination Report for European Patent Application No. 17755402.9, dated Dec. 20, 2021, 12 pages.
Examination Report for European Patent Application No. 17755403.7, dated Dec. 20, 2021, 13 pages.
International Search Report and Written Opinion for International Patent Application No. PCT/US2021/043968, dated Nov. 19, 2021, 15 pages.
Notice of Allowance for Japanese Patent Application No. 2019507767, dated Jan. 19, 2021, 6 pages.
Non-Final Office Action for U.S. Appl. No. 16/427,019, dated Dec. 2, 2021, 17 pages.
Corrected Notice of Allowability for U.S. Appl. No. 16/678,551, dated Nov. 24, 2021, 3 pages.
Corrected Notice of Allowability for U.S. Appl. No. 16/678,573, dated Nov. 24, 2021, 3 pages.
Final Office Action for U.S. Appl. No. 16/678,586, dated Nov. 22, 2021, 15 pages.
Corrected Notice of Allowability for U.S. Appl. No. 16/678,602, dated Nov. 24, 2021, 4 pages.
Corrected Notice of Allowability for U.S. Appl. No. 16/678,602, dated Dec. 30, 2021, 4 pages.
Non-Final Office Action for U.S. Appl. No. 16/426,527, dated Feb. 16, 2022, 9 pages.
Corrected Notice of Allowability for U.S. Appl. No. 16/678,551, dated Jan. 27, 2022, 3 pages.
Corrected Notice of Allowability for U.S. Appl. No. 16/678,573, dated Jan. 27, 2022, 3 pages.
Advisory Action for U.S. Appl. No. 16/678,586, dated Jan. 26, 2022, 3 pages.
Non-Final Office Action for U.S. Appl. No. 16/678,586, dated Mar. 3, 2022, 14 pages.
Corrected Notice of Allowability for U.S. Appl. No. 16/678,602, dated Feb. 2, 2022, 4 pages.
Non-Final Office Action for U.S. Appl. No. 17/102,957, dated Feb. 17, 2022, 9 pages.
Decision to Grant for Japanese Patent Application No. 2019507765, dated Feb. 10, 2022, 6 pages.
Decision to Grant for Japanese Patent Application No. 2019507768, dated Feb. 10, 2022, 6 pages.
Office Letter for Taiwanese Patent Application No. 108140788, dated Jan. 5, 2022, 16 pages.
International Search Report and Written Opinion for International Patent Application No. PCT/US2021/062509, dated Mar. 29, 2022, 20 pages.
Corrected Notice of Allowability for U.S. Appl. No. 16/678,551, dated Mar. 9, 2022, 3 pages.
Corrected Notice of Allowability for U.S. Appl. No. 16/678,573, dated May 6, 2022, 3 pages.
Corrected Notice of Allowability for U.S. Appl. No. 16/678,602, dated Apr. 8, 2022, 4 pages.
Notice of Allowance for U.S. Appl. No. 17/109,935, dated Apr. 20, 2022, 15 pages.
Invitation to Pay Additional Fees and Partial International Search for International Patent Application No. PCT/US2021/063094, dated Apr. 19, 2022, 15 pages.
Quayle Action for U.S. Appl. No. 16/426,527, dated May 26, 2022, 5 pages.
Advisory Action for U.S. Appl. No. 16/427,019, dated Jun. 2, 2022, 3 pages.
Corrected Notice of Allowability for U.S. Appl. No. 16/678,551, dated May 13, 2022, 3 pages.
Corrected Notice of Allowability for U.S. Appl. No. 16/678,551, dated Jun. 15, 2022, 3 pages.
Corrected Notice of Allowability for U.S. Appl. No. 16/678,573, dated Jun. 10, 2022, 3 pages.
Corrected Notice of Allowability for U.S. Appl. No. 16/678,602, dated May 13, 2022, 4 pages.
Corrected Notice of Allowability for U.S. Appl. No. 16/678,602, dated Jun. 10, 2022, 4 pages.
Final Office Action for U.S. Appl. No. 16/844,406, dated Jun. 24, 2022, 17 pages.
International Search Report and Written Opinion for International Patent Application No. PCT/US2021/063093, dated May 4, 2022, 15 pages.

* cited by examiner

GALLIUM-NITRIDE-BASED MODULE WITH ENHANCED ELECTRICAL PERFORMANCE AND PROCESS FOR MAKING THE SAME

RELATED APPLICATIONS

This application claims the benefit of provisional patent application Ser. No. 62/652,380, filed Apr. 4, 2018, the disclosure of which is hereby incorporated herein by reference in its entirety.

FIELD OF THE DISCLOSURE

The present disclosure relates to a Gallium-Nitride (GaN) based module and a process for making the same, and more particularly to a GaN based module with enhanced electrical performance, and a packaging process to enhance electrical performance of GaN based modules in an economical way.

BACKGROUND

Gallium-Nitride (GaN) has long been recognized as a superior single crystal semiconductor material for use in high frequency and high power applications. The critical peak electric field in GaN semiconductors is about 12 times larger than silicon, which allows for the fabrication of very narrow gate length field-effect devices with superior channel breakdown characteristics. In addition, the electron saturation velocity is about 2.5 times larger than silicon, which allows for the engineering of field-effect transistor (FET) channel structures with very low on-resistance characteristics.

One major issue with the commercialization of GaN based FET devices has been the fact that a native low-cost GaN single crystal substrate is not feasible. Conventionally, the GaN material has been grown by epitaxy on silicon carbide (SiC) substrates due to the fact that the lattice constants of these two semiconductors are fairly similar and SiC has remarkably ideal thermal conductivity characteristics. However, the SiC substrates for GaN-on-SiC technologies are extremely expensive and are only available at 100 mm—and more recently—150 mm diameters. In addition, due to the complexities of the crystal growth of SiC, a supply chain for high volume SiC substrates does not exist currently. These drawbacks make the GaN-on-SiC technologies unsuitable for large volume commercial applications, such as those targeted for the mobile industry.

Notably, in the recent years, there has been a worldwide focus on the research of methods to grow single crystal GaN on silicon substrates, which is much more cost effective than the SiC substrates. It is, however, well known to those skilled in the art that the GaN and Si have large mismatches in the lattice constants (5.431 A for Si, 5.125 A for GaN). In addition, the silicon substrate has a number of deleterious properties for operation in radio frequency (RF) applications, such as the generation and coupling of harmonics and intermodulation distortion products.

To utilize advantages of GaN material in FET devices in an economical way, and to reduce deleterious harmonic distortion in the RF applications, it is therefore an object of the present disclosure to provide an improved and inexpensive module design with enhanced electrical performance. Further, there is also a need to keep the module size efficient.

SUMMARY

The present disclosure relates to a Gallium-Nitride (GaN) based module and a process for making the same. The disclosed GaN based module includes a module substrate, a thinned switch die, a first mold compound, and a second mold compound. The module substrate includes a substrate body having a top surface and a bottom surface. The thinned switch die is attached to the top surface of the substrate body and includes an electrode region, a number of switch interconnects, an aluminium gallium nitride (AlGaN) barrier layer, a GaN buffer layer, and a lateral two-dimensional electron gas (2DEG) layer. Each switch interconnect extends from a bottom surface of the electrode region to the top surface of the substrate body, the AlGaN barrier layer is over a top surface of the electrode region, the GaN buffer layer is over the AlGaN barrier layer, and the 2DEG layer is realized at a heterojunction of the AlGaN barrier layer and the GaN buffer layer. Herein, the first mold compound resides over the top surface of the substrate body, surrounds the thinned switch die, and extends above a top surface of the thinned switch die to form an opening over the top surface of the thinned switch die. The second mold compound fills the opening to encapsulate the thinned switch die.

According to another embodiment, the GaN based module further includes an intact controller die attached to the top surface of the substrate body. The intact controller die is configured to control operation of the thinned switch die. Herein, the intact controller die includes a device layer, a number of controller interconnects extending from a bottom surface of the device layer to the top surface of the substrate body, and a silicon controller substrate over a top surface of the device layer. In addition, the first mold compound encapsulates the intact controller die.

According to another embodiment, the GaN based module further includes a third mold compound and an intact controller die. The intact controller die is attached to the bottom surface of the substrate body and configured to control operation of the thinned switch die. Herein, the intact controller die includes a device layer, a number of controller interconnects extending from a bottom surface of the device layer to the bottom surface of the substrate body, and a silicon controller substrate over a top surface of the device layer. In addition, the third mold compound resides over the bottom surface of the substrate body and encapsulates the intact controller die.

In one embodiment of the GaN based module, the first mold compound and the third mold compound are formed from a same material.

In one embodiment of the GaN based module, the module substrate further includes connecting layers. Herein, the connecting layers are integrated in the substrate body. First portions of the connecting layers are exposed at the top surface of the substrate body, and second portions of the connecting layers are exposed at the bottom surface of the substrate body. Each switch interconnect is electrically coupled to a corresponding first portion of the connecting layers, and each controller interconnect is electrically coupled to a corresponding second portion of the connecting layers. In some applications, the GaN based module further includes a number of external contacts, each of which is electrically coupled to a corresponding second portion of the connecting layers, extends through the third mold compound, and is exposed at a bottom of the third mold compound.

In one embodiment of the GaN based module, the second mold compound has an electrical resistivity greater that 1E6 Ohm-cm.

In one embodiment of the GaN based module, the second mold compound has a thermal conductivity greater than 2 W/m·K.

In one embodiment of the GaN based module, the first mold compound and the second mold compound are formed from different materials.

In one embodiment of the GaN based module, the first mold compound is formed from a same material as the second mold compound.

In one embodiment of the GaN based module, the second mold compound is in contact with the GaN buffer layer of the thinned switch die.

In one embodiment of the GaN based module, the thinned switch die further includes a transitional layer over the GaN buffer layer and the second mold compound is in contact with the transitional layer.

In one embodiment of the GaN based module, the module substrate further includes connecting layers and a number of module contacts. Herein, the connecting layers are integrated in the substrate body and the module contacts are formed at the bottom surface of the substrate body. First portions of the connecting layers are exposed at the top surface of the substrate body, and second portions of the connecting layers are exposed at the bottom surface of the substrate body. Each switch interconnect is electrically coupled to a corresponding first portion of the connecting layers, and each module contact is electrically coupled to a corresponding second portion of the connecting layers.

According to another embodiment, the GaN based module further includes a thermally conductive film residing over at least the top surface of the thinned switch die at a bottom of the opening. Herein, the second mold compound directly resides over the thermally conductive film and fills the opening.

In one embodiment of the GaN based module, the thermally conductive film has a thermal conductivity between 5 w/m·k and 5000 w/m·k.

In one embodiment of the GaN based module, the thermally conductive film has a thickness between 0.1 μm and 100 μm.

In one embodiment of the GaN based module, the thermally conductive film is formed from one of a group consisting of chemical vapor deposition (CVD) diamond, boron nitride, aluminum nitride, alumina, and beryllium oxide.

In one embodiment of the GaN based module, the thermally conductive film has a higher thermal conductivity than the second mold compound.

According to an exemplary process, a precursor package including a number of switch dies, a package substrate, and a first mold compound is provided firstly. Herein, the package substrate includes a number of module substrates wherein an inter-module area is in between every two adjacent module substrates. Each switch die resides over a corresponding module substrate, and includes an electrode region, a number of switch interconnects extending from a bottom surface of the electrode region to the corresponding module substrate, an AlGaN barrier layer over a top surface of the electrode region, a GaN buffer layer over the AlGaN barrier layer, a lateral 2DEG layer realized at a heterojunction of the AlGaN barrier layer and the GaN buffer layer, and a silicon switch substrate over the GaN buffer layer. The first mold compound encapsulates side surfaces of each switch die, such that a top surface of the silicon switch substrate of each switch die is exposed. Next, the silicon switch substrate of each switch die is removed substantially to provide a number of thinned switch dies. There is an opening formed over each thinned switch die and a top surface of each thinned switch die is exposed at a bottom of the opening. A second mold compound is then applied to substantially fill each opening to form a GaN based package. Lastly, the GaN based package is singulated at each inter-module area to provide a number of individual GaN based modules. Herein, each GaN based module includes at least one thinned switch die and one module substrate.

In one embodiment of the process, the precursor package further includes a number of intact controller dies. Herein, each intact controller die resides over the corresponding module substrate and is configured to control operation of a corresponding switch die. Each intact controller die includes a device layer, a number of controller interconnects extending from a bottom surface of the device layer to the corresponding module substrate, and a silicon controller substrate over a top surface of the device layer. The first mold compound fully encapsulates each intact controller die, and each of the GaN based modules includes at least one thinned switch die, at least one intact controller die and one module substrate.

In one embodiment of the process, each intact controller die is shorter than each switch die.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
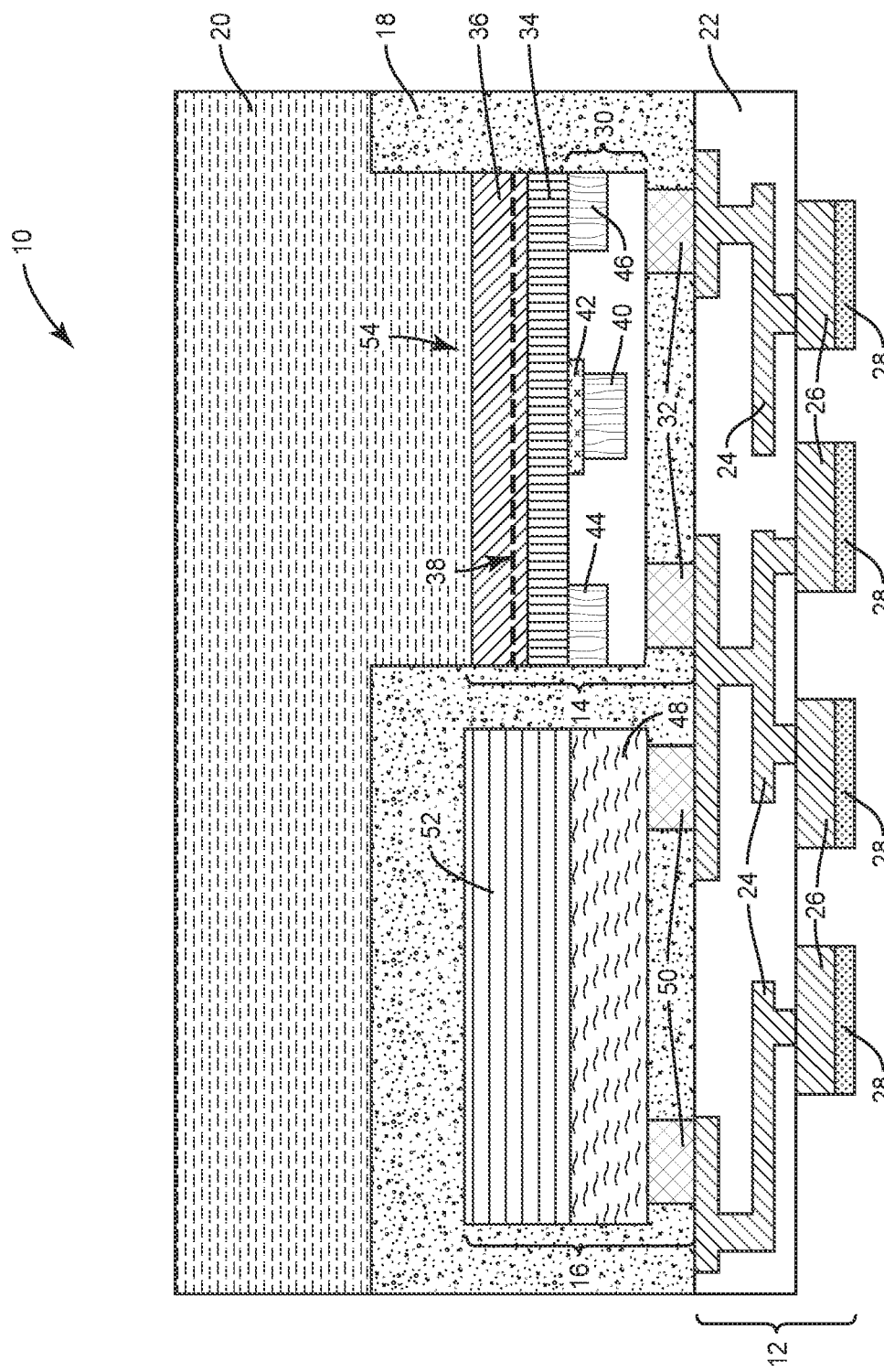
FIG. 1 shows an exemplary Gallium-Nitride (GaN) based module according to one embodiment of the present disclosure.

FIGS. 4-9 provide exemplary steps that illustrate a process to fabricate the exemplary GaN based module shown in FIG. 1.

It will be understood that for clear illustrations, FIGS. 1-9 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a Gallium-Nitride (GaN) based module and a process for making the same. FIG. 1 shows an exemplary GaN based module 10 according to one embodiment of the present disclosure. For the purpose of this illustration, the exemplary GaN based module 10 includes a module substrate 12, a thinned switch die 14, a complementary metal-oxide-semiconductor (CMOS) controller die 16, a first mold compound 18, and a second mold compound 20. In different applications, the GaN based module 10 may include fewer or more dies. For instance, in some applications, the GaN based module 10 may include multiple thinned switch dies. In some applications, the GaN based module 10 may only include the thinned switch die 14 while the CMOS controller 16 is omitted. In some applications, the GaN based module 10 may further include integrated passive device dies (not shown).

In detail, the module substrate 12 may be formed from a laminate, a wafer level fan out (WLFO) carrier, a lead frame, a ceramic carrier, or the like. Herein, the module substrate 12 includes a substrate body 22, connecting layers 24, and a number of module contacts 26. The connecting layers 24 are integrated in the substrate body 22, and the module contacts 26 are formed at a bottom surface of the substrate body 22. First portions of the connecting layers 24 are exposed at a top surface of the substrate body 22 and electrically coupled to the thinned switch die 14 and the CMOS controller 16 (details are described in following paragraphs). Second portions of the connecting layers 24 are exposed at the bottom surface of the substrate body 22 and each second portion of the connecting layers 24 is electrically coupled to a corresponding module contact 26. Consequently, the connecting layers 24 may connect the thinned switch die 14 with the CMOS controller 16, and/or connect the thinned switch die 14/CMOS controller 16 to certain ones of the module contacts 26. In addition, each module contact 26 may be covered by a solder cap 28.

Both the thinned switch die 14 and the CMOS controller die 16 reside over the module substrate 12. The thinned switch die 14 includes an electrode region 30, a number of switch interconnects 32, an aluminium gallium nitride (AlGaN) barrier layer 34, a GaN buffer layer 36, and a lateral two-dimensional electron gas (2DEG) layer 38. Each switch interconnect 32 extends from the bottom surface of the electrode region 30 towards the module substrate 12, and is electrically coupled to a corresponding first portion of the connecting layers 24 at the top surface of the substrate body 22. The AlGaN barrier layer 34 is formed of AlGaN and resides over a top surface of the electrode region 30. The GaN buffer layer 36 is formed of GaN and resides over the AlGaN barrier layer 34. The lateral 2DEG layer 38 is realized at the heterojunction of the AlGaN barrier layer 34 and the GaN buffer layer 36. The lateral 2DEG layer 38 will be filled with highly mobile and abundant electrons when a suitable gate voltage in applied to a gate region of a FET transistor (more details are described below). The electrode region 30 has a thickness between 1 µm and 25 µm, each switch interconnect 32 has a height between 1 µm and 20 µm, the AlGaN barrier layer 34 has a thickness between 1 nm and 5000 nm, and the GaN buffer layer 36 has a thickness between 1 nm and 5000 nm.

Herein, the electrode region 30 may include multiple metal layers, vias, and passivation layers (not shown for simplicity) necessary for a FET process. In one embodiment, the electrode region 30 includes a gate electrode 40, a gate dielectric layer 42 in between the AlGaN barrier layer 34 and the gate electrode 40, a drain electrode 44, and a source electrode 46. The drain electrode 44 and the source electrode 46 are connected to the AlGaN barrier layer 34. Each of the gate electrode 40, the drain electrode 44, and the source electrode 46 may be electrically coupled to a corresponding switch interconnect 32 by vias (not shown). A suitable gate voltage may be applied to the gate electrode 40 through a corresponding switch interconnect 32 and vias, such that the lateral 2DEG layer 38 is filled with highly mobile and abundant electrons. In some applications, the drain electrode 44 and the source electrode 46 may extend through the AlGaN barrier layer 34 to form ohmic contacts with the lateral 2DEG layer 38, and the gate electrode 40 may be formed as a Schottky contact to the AlGaN barrier layer 34 without the gate dielectric layer 42 (not shown). When the thinned switch die 14 is "ON", the lateral 2DEG layer 38 is conducted, and the electrons move from the drain electrode 44 to the source electrode 46. When the thinned switch die 14 is "OFF", the lateral 2DEG layer 38 is not conducted, and there is no electron moving from the drain electrode 44 to the source electrode 46.

In one embodiment, the thinned switch die 14 may further include a transitional layer (not shown) formed over the GaN buffer layer 36. The transitional layer may be a low temperature aluminum nitride (LT-AlN) layer, a combination of multiple thin aluminum nitride and gallium nitride layers (AlN/GaN superlattices), a compositionally graded AlGaN layer, or a single low-aluminum content AlGaN layer. Consequently, in some applications, a top surface of the thinned switch die 14 may be a top surface of the GaN buffer layer 36. For other cases, the top surface of the thinned switch die 14 may be a top surface of the transitional layer (not shown). Notice that the thinned switch die 14 has no silicon-related substrate over the GaN buffer layer 36 or the transitional layer.

The CMOS controller die 16 includes a device layer 48, a number of controller interconnects 50 formed at a bottom surface of the device layer 48, and a silicon controller substrate 52 over a top surface of the device layer 48. The device layer 48 includes a CMOS controller (not shown) that is configured to control operation ("ON" and "OFF") of the thinned switch die 14. Each controller interconnect 50 extends from the bottom surface of the device layer 48 towards the top surface of the substrate body 22, and is electrically coupled to a corresponding first portion of the connecting layers 24 exposed at the top surface of the substrate body 22. The device layer 48 has a thickness between 0.5 m and 20 μm, and may be formed from a combination of passivation and metal layers (such as oxide, nitride, aluminum, titanium, copper, or the like). The CMOS controller die 16 is an intact die, and the silicon controller substrate 52 is an intact substrate with a thickness between 50 μm and 250 μm or between 50 μm and 750 μm.

The first mold compound 18 resides over the top surface of the substrate body 22, surrounds the thinned switch die 14, and encapsulates the CMOS controller die 16. Further, the first mold compound 18 extends beyond the top surface of the thinned switch die 14 to define an opening 54 within the first mold compound 18 and over the thinned switch die 14. Herein, the top surface of the thinned switch die 14 is exposed at a bottom of the opening 54. If the thinned switch die 14 does not include a transitional layer, the top surface of the GaN buffer layer 36 is exposed at the bottom of the opening 54. If the thinned switch die 14 includes a transitional layer, the top surface of the transitional layer (not shown) is exposed at the bottom of the opening 54. In some applications, the GaN based module 10 may further include an underfilling layer (not shown) to encapsulate the switch interconnects 32 and the controller interconnects 50. The underfilling layer resides between the top surface of the substrate body 22 and the first mold compound 18, and underfills the thinned switch die 14 and the CMOS controller die 16. The underfilling layer may be formed from the same or different material as the first mold compound 18.

The second mold compound 20 substantially fills the opening 54 to encapsulate the thinned switch die 14. The second mold compound may be in contact with the top surface of the thinned switch die 14 and may further reside over the first mold compound 18. The second mold compound 20 has a thermal conductivity greater than 2 W/m·K or greater than 10 W/m·K, and has an electrical resistivity greater than 1E6 Ohm-cm. In general, the higher the thermal conductivity of the second mold compound 20, the better the thermal performance of the thinned switch die 14. Further, the high electrical resistivity of the second mold compound 20 may improve the RF performance of the thinned switch die 14.

The second mold compound 20 may be formed of thermoplastics or thermoset materials, such as PPS (poly phenyl sulfide), overmold epoxies doped with boron nitride or alumina thermal additives, or the like. The second mold compound 20 may be formed of a same or different material as the first mold compound 18. However, unlike the second mold compound 20, the first mold compound 18 does not have thermal conductivity or electrical resistivity requirements. Herein, a portion of the second mold compound 20 may reside over a top surface of the first mold compound 18. Notice that the second mold compound 20 is separate from the CMOS controller die 16 by the first mold compound 18. A top surface of the CMOS controller die 16 is in contact with the first mold compound 18.

Figure 2:
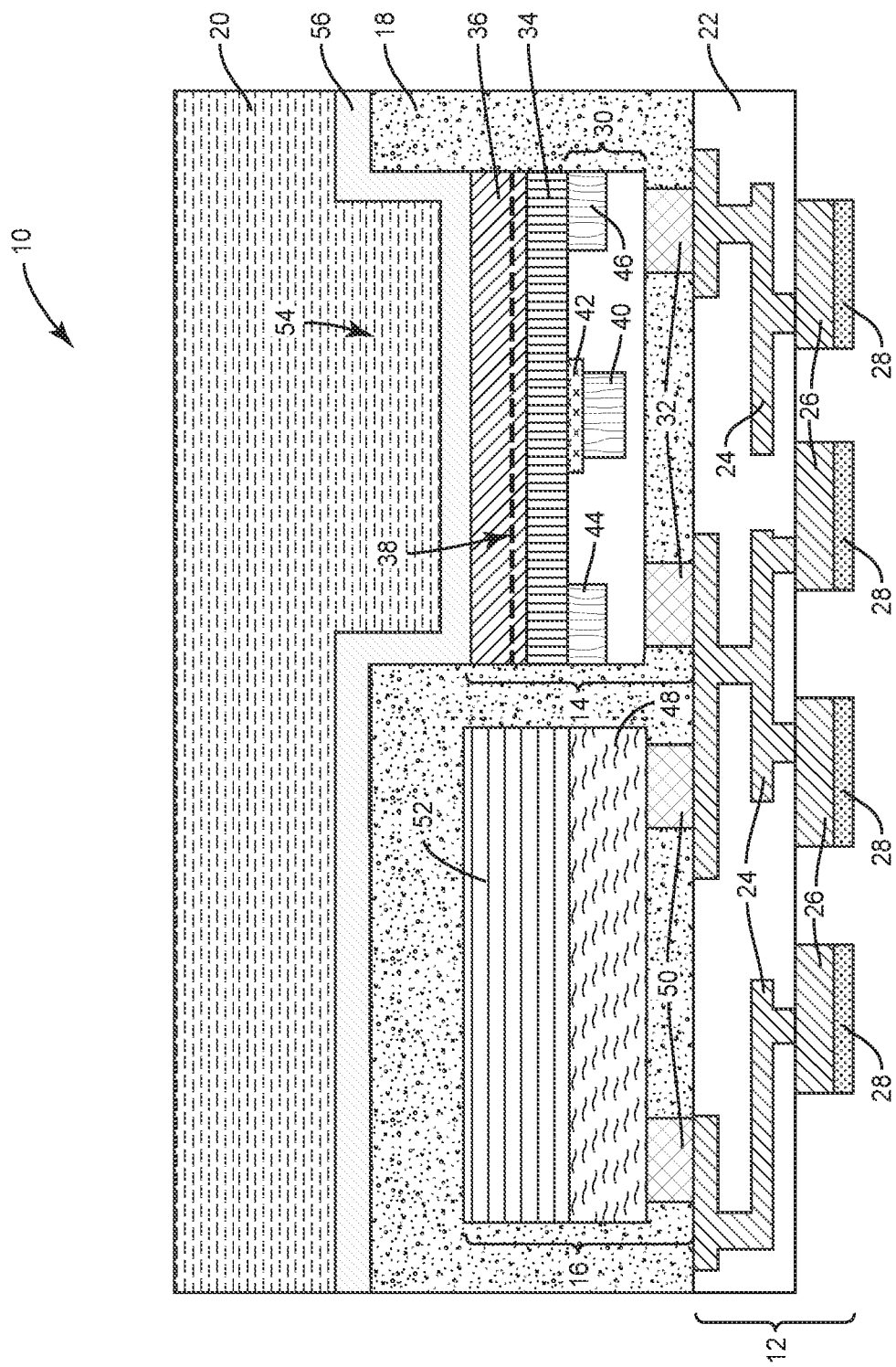
FIG. 2 shows an exemplary GaN based module with a thermally conductive film.

In some applications, the GaN based module 10 may further include a thermally conductive film 56 continuously deposited over exposed surfaces of the opening 54 and over the first mold compound 18, as illustrated in FIG. 2. Within the opening 54, the thermally conductive film 56 is immediately above the top surface of the thinned switch die 14 with no significant voids or defects. Herein, no significant voids or defects refers to no voids or defects larger than 0.1 m between the thermally conductive film 54 and the top surface of the thinned switch die 14. In some applications, the thermally conductive film 56 only covers the top surface of the thinned flip chip die 14 (not shown). Herein, the second mold compound 20 directly resides over the thermally conductive film 56 to substantially fill the opening 54.

The thermally conductive film 56 has a high thermal conductivity between 5 w/m·k and 5000 w/m·k and a high electrical resistivity greater than 1E6 Ohm-cm. Typically, the thermally conductive film 56 has a higher thermal conductivity than the second mold compound 20. The thermally conductive film 56 may be formed of chemical vapor deposition (CVD) diamond, aluminum nitride, boron nitride, alumina, beryllium oxide, or the like. Depending on different deposition stresses, different deposited materials, and different applications of the thinned switch die 14, the thermally conductive film 56 has different thicknesses varying from 0.1 μm to 100 μm. For a CVD diamond material, which has an extremely high conductivity greater than 2000 w/m·k, a 1 μm or greater thickness of the thermally conductive film 56 is extremely effective for the heat dissipation management of the thinned switch die 14. For a boron nitride material, which has a high conductivity between 50 w/m·k-100 w/m·k, a 5 μm-10 μm thickness of the thermally conductive film 56 is desirable.

Figure 3:
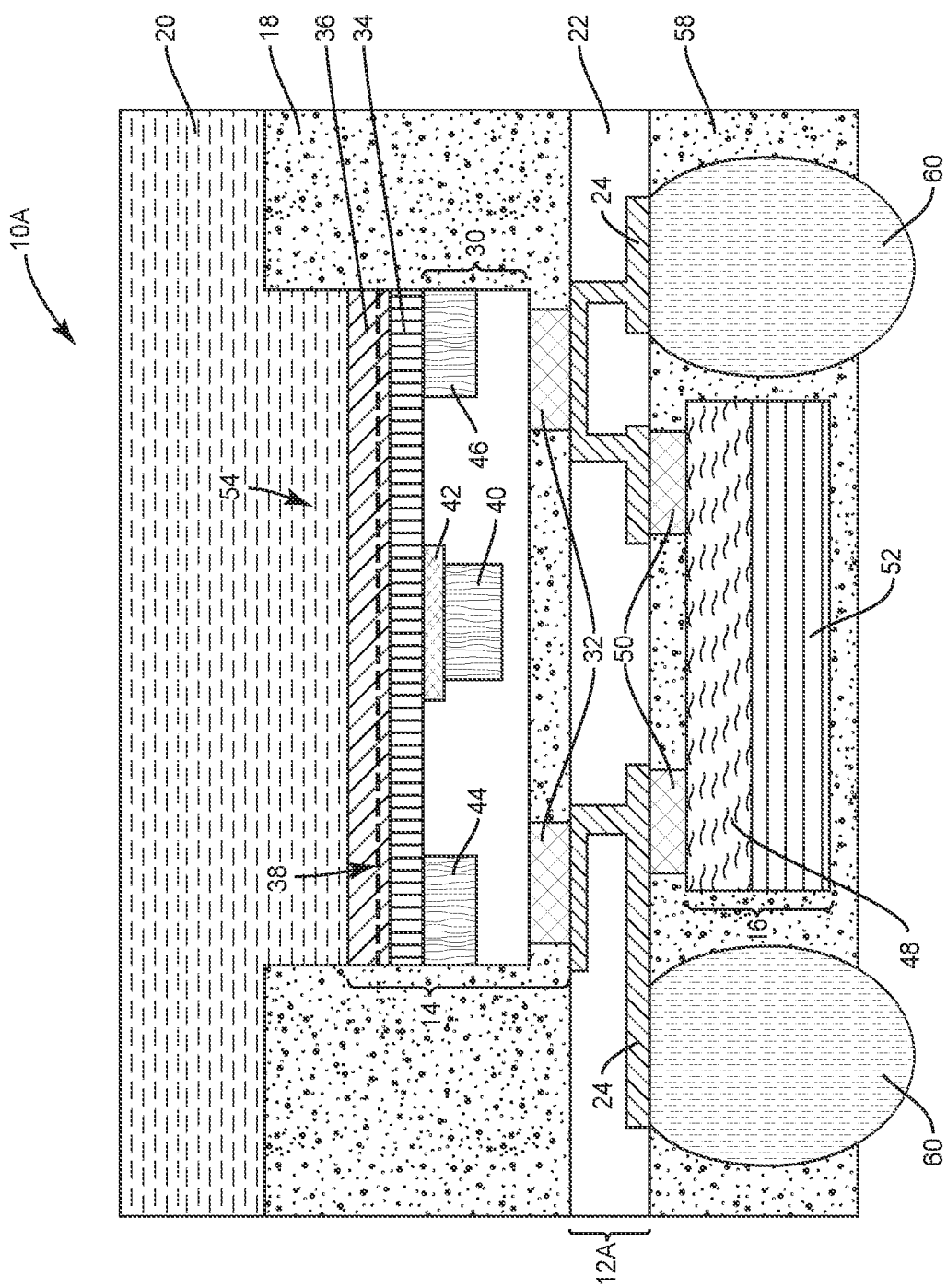
FIG. 3 shows an alternative GaN based module according to one embodiment of the present disclosure.

To reduce the footprint of a module, the thinned switch die 14 and the CMOS controller die 16 may be placed at opposite sides of a module substrate. FIG. 3 shows an alternative GaN based module 10A, which includes an alternative module substrate 12A, the thinned switch die 14, the CMOS controller die 16, the first mold compound 18, the second mold compound 20, and a third mold compound 58. The alternative module substrate 12A may be formed from a laminate, a wafer-level-fan-out (WLFO) carrier, a lead frame, a ceramic carrier, or the like. In one embodiment, the alternative module substrate 12A includes the substrate body 22 and the connecting layers 24 without the module contacts 26. The connecting layers 24 are integrated in the substrate body 22 and configured to connect the thinned switch die 14 with the CMOS controller die 16. First portions of the connecting layers 24 are exposed at the top surface of the substrate body 22 and electrically coupled to the thinned switch die 14. Second portions of the connecting layers 24 are exposed at the bottom surface of the substrate body 22 and electrically coupled to the CMOS controller die 16 (details are described in following paragraphs).

The thinned switch die 14 is attached to the top surface of the substrate body 22, while the CMOS controller die 16 is attached to the bottom surface of the substrate body 22. Each switch interconnect 32 of the thinned switch die 14 is electrically coupled to a corresponding first portion of the connecting layers 24 at the top surface of the substrate body 22. Each controller interconnect 50 of the CMOS controller die 16 is electrically coupled to a corresponding second portion of the connecting layers 24 at the bottom surface of the substrate body 22.

In this embodiment, the first mold compound 18 resides over the top surface of the substrate body 22 and surrounds the thinned switch die 14. The first mold compound 18 extends beyond the top surface of the thinned switch die 14 to define the opening 54 within the first mold compound 20 and over the thinned switch die 14. Herein, the top surface of the thinned switch die 14 is exposed at the bottom of the opening 54. The second mold compound 20 substantially fills the opening 54 to encapsulate the thinned switch die 14. Herein, the second mold compound 20 may be in contact with the top surface of the thinned switch die 14, and may further reside over the first mold compound 18. The third mold compound 58 resides over the bottom surface of the substrate body 22 and encapsulates the CMOS controller die 16. In addition, the alternative GaN based module 10A may also include external contacts 60, each of which is electrically coupled to a corresponding second portion of the connecting layers 24 at the bottom surface of the substrate body 22. Each external contact 60 extends through the third mold compound 58 and is exposed at bottom of the third mold compound 58. Each external contact 60 is separate from the CMOS controller die 16 by the third mold compound 58.

FIGS. 4-9 provide exemplary steps to fabricate the exemplary GaN based module 10 shown in FIG. 1. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 4-9.

Figure 4:
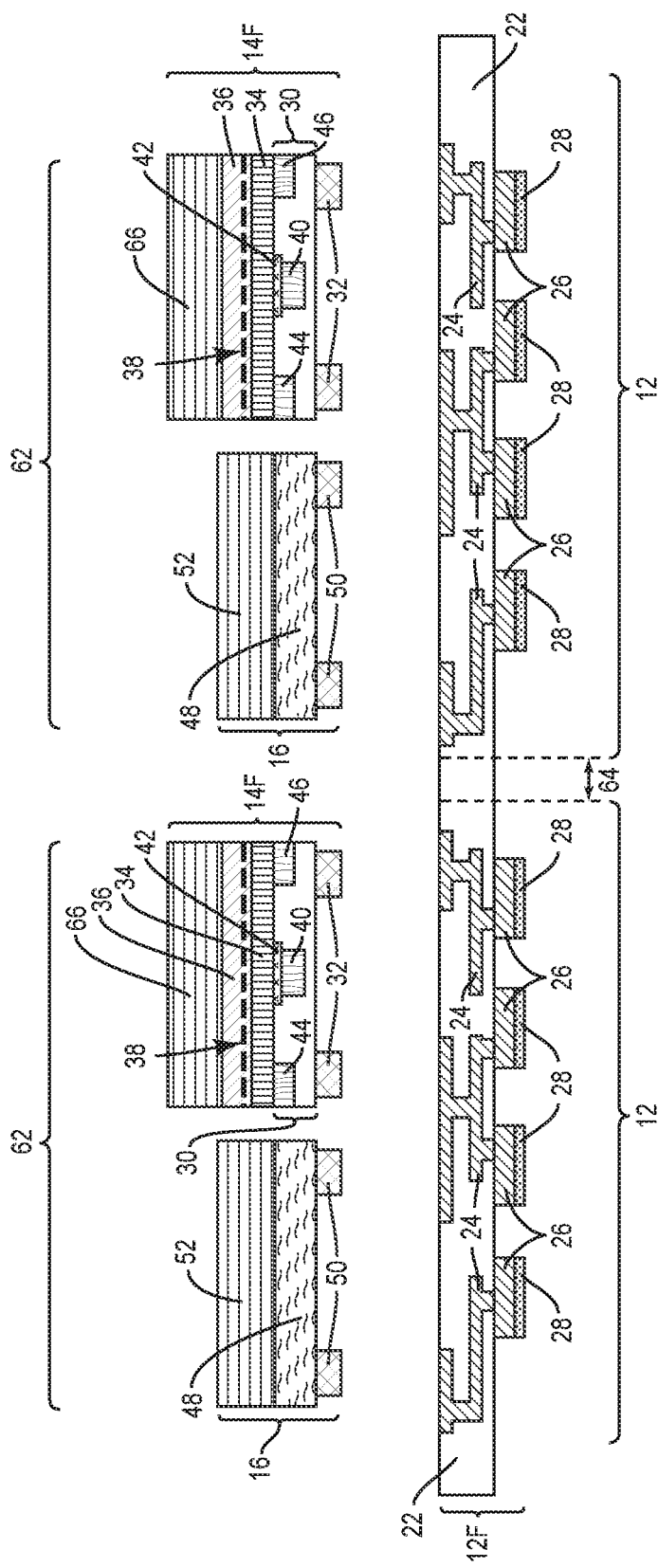

Initially, a number of device groups 62 are attached to a package substrate 12F as depicted in FIG. 4. The device groups 62 may be attached to the package substrate 12F via an adhesive material (not shown). The package substrate 12F includes a number of the module substrates 12, and a number of inter-module areas 64. Each inter-module area 64 is in between every two adjacent module substrates 12 and has a small width. Herein, each device group 62 is attached to a corresponding module substrate 12, and does not reside on any inter-module area 64. As described above, each module substrate 12 includes the substrate body 22, the connecting layers 24, the module contacts 26, and the solder caps 28.

In this embodiment, each device group 62 includes a switch die 14F and the CMOS controller die 16. In different applications, there might be fewer or more devices included in one device group 62. The switch die 14F includes the electrode region 30, the switch interconnects 32 formed at the bottom surface of the electrode region 30, the AlGaN barrier layer 34 over the top surface of the electrode region 30, the GaN buffer layer 36 over the AlGaN barrier layer 34, the lateral 2DEG layer 38 realized at the heterojunction of the AlGaN barrier layer 34 and the GaN buffer layer 36, and a silicon switch substrate 66 over the GaN buffer layer 36. As such, the backside of the silicon switch substrate 66 is a top surface of the switch die 14F. In some applications, the switch die 14F may further include a transitional layer (not shown) formed between the silicon switch substrate 66 and the GaN buffer layer 36. The transitional layer may be a low temperature aluminum nitride (LT-AlN) layer, a combination of multiple thin aluminum nitride and gallium nitride layers (AlN/GaN superlattices), a compositionally graded AlGaN layer, or a single low-aluminum content AlGaN layer. In addition, each switch interconnect 32 of the switch die 14F extends from the bottom surface of the electrode region 30 towards its corresponding module substrate 12, and is electrically coupled to a corresponding connecting layer 24.

Herein, the switch die 14F has a thickness between 20 µm and 500 µm, and the silicon switch substrate 66 has a thickness between 20 m and 500 µm. The CMOS controller die 16 has a thickness between 20 µm and 500 µm, and the silicon controller substrate 52 has a thickness between 20 m and 500 µm. Note that the CMOS controller die 16 is always shorter than the switch die 14F.

Figure 5:
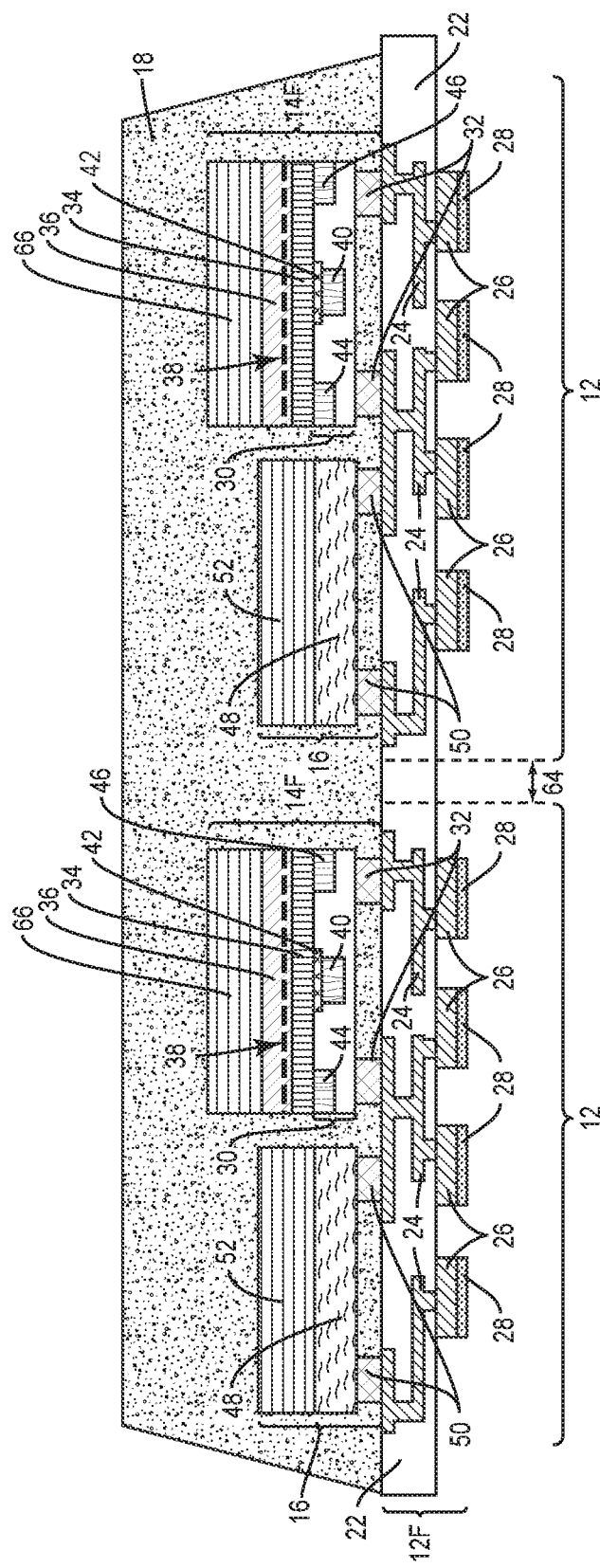

Next, the first mold compound 18 is applied to the package substrate 12F, covers the top surface of each substrate body 22, and encapsulates each switch die 14F and each CMOS controller die 16, as illustrated in FIG. 5. The first mold compound 18 may be applied by various procedures, such as sheet molding, overmolding, compression molding, transfer molding, dam fill encapsulation, or screen print encapsulation. The first mold compound 18 may be an organic epoxy resin system or the like, which can be used as an etchant barrier to protect the switch die 14F and the CMOS controller die 16 against etching chemistries such as potassium hydroxide (KOH), sodium hydroxide (NaOH), and acetylcholine (ACH). A curing process (not shown) is then used to harden the first mold compound 18. The curing temperature is between 100° C. and 320° C. depending on which material is used as the first mold compound 18.

Figure 6:
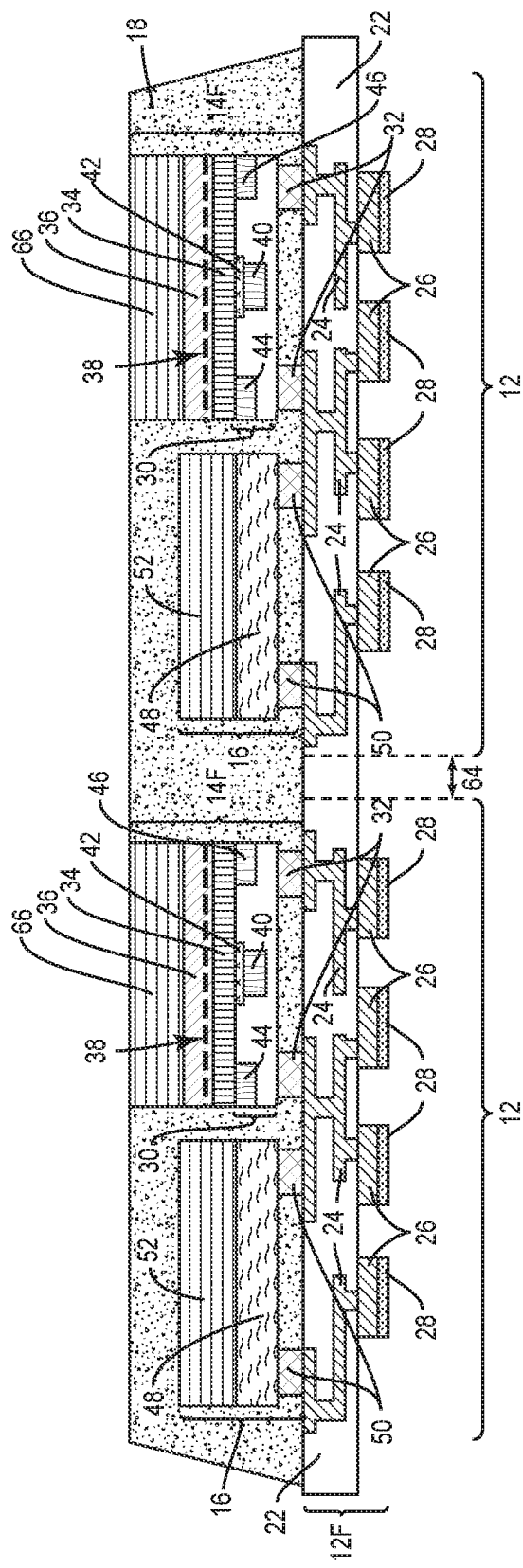

The first mold compound 18 is then thinned down to expose the silicon switch substrate 66 of each switch die 14F, as illustrated in FIG. 6. The thinning procedure may be done with a mechanical grinding process. Since the CMOS controller die 16 has a lower height than the switch die 14F, the silicon controller substrate 52 of the CMOS controller die 16 is not exposed and is still encapsulated by the first mold compound 18.

Figure 7:
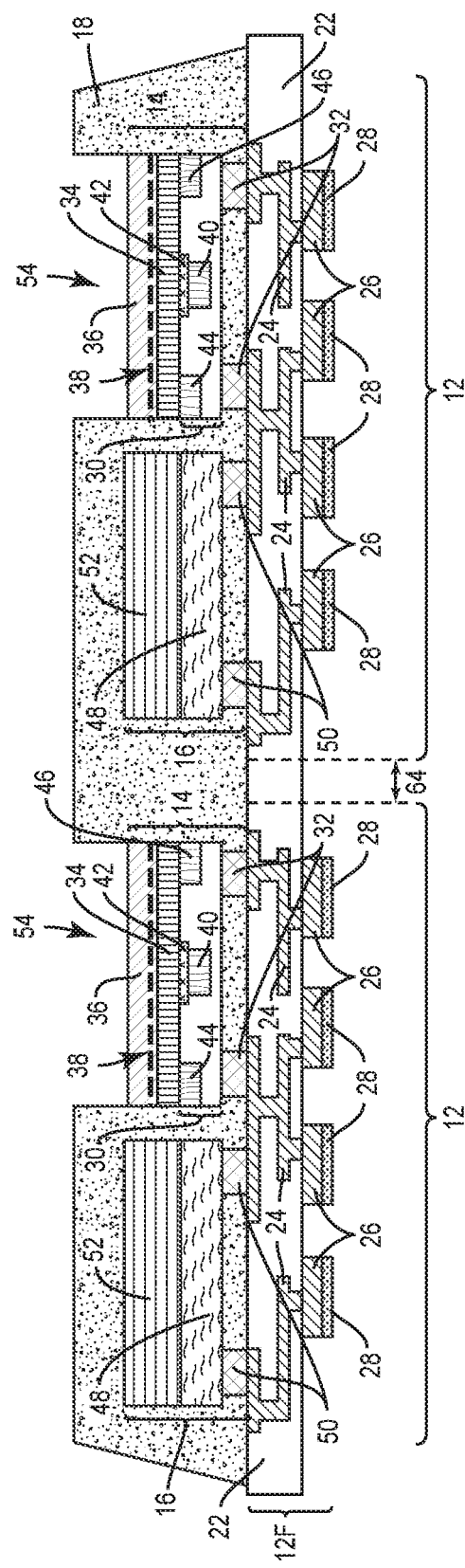

The following step is to substantially remove the silicon switch substrate 66 as shown in FIG. 7. The removal of the silicon switch substrate 66 from the switch die 14F provides the thinned switch die 14 and forms the opening 54 that is within the first mold compound 18 and over the thinned switch die 14. Herein, if the switch die 14F includes a transitional layer between the silicon switch substrate 66 and the GaN buffer layer 36, this transitional layer may be partially or completely removed. In the thinned switch die 14, there is no portion of the silicon switch substrate 66 left over the GaN buffer layer 36, and the GaN buffer layer 36 (or the transitional layer) is exposed at the bottom of the opening 54. Removing substantially the silicon switch substrate 66 may be provided by an etching process with a wet/dry etchant chemistry, which may be TMAH, KOH, ACH, NaOH, or the like.

Figure 8:
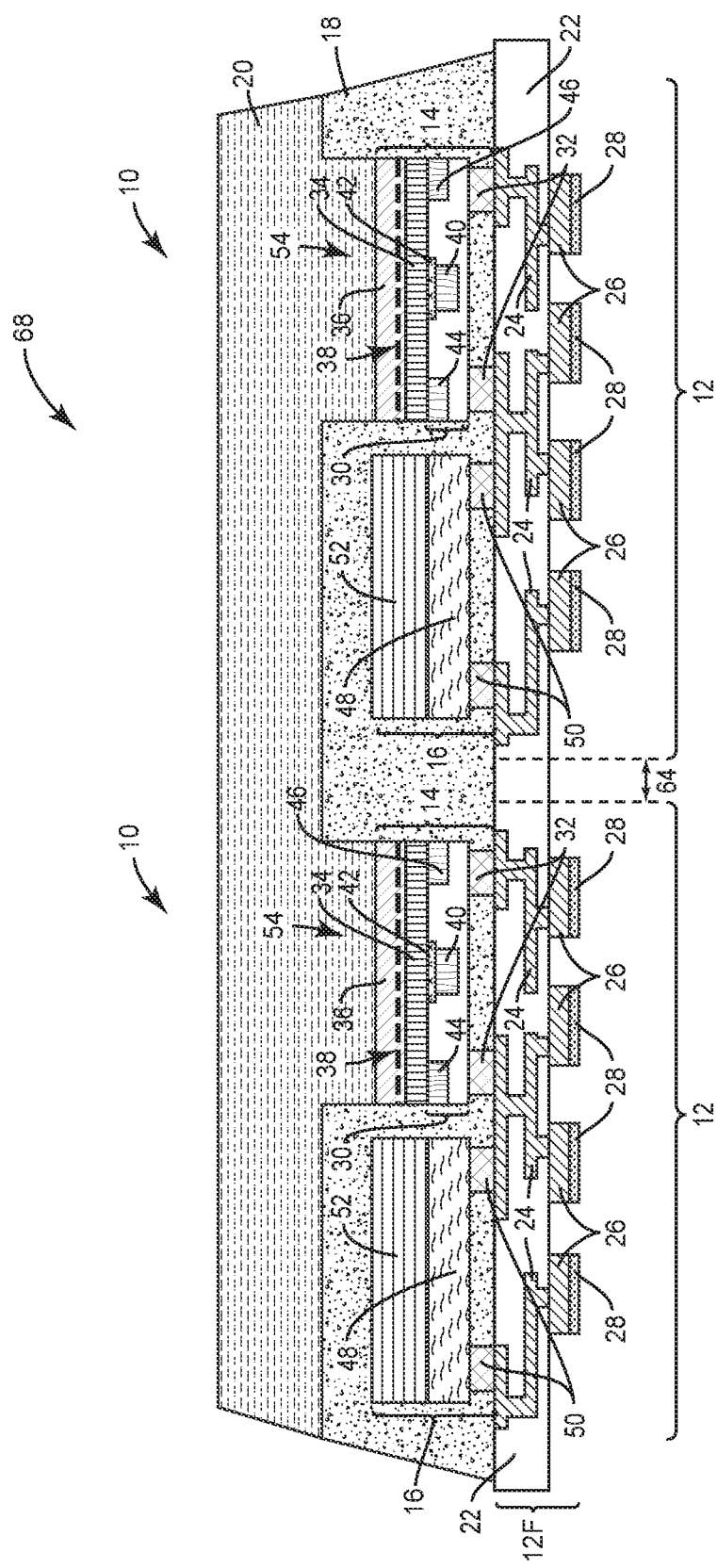

The second mold compound 20 is then applied to substantially fill each opening 54 to form a GaN based package 68, as illustrated in FIG. 8. The second mold compound 20 may be applied by various procedures, such as sheet molding, overmolding, compression molding, transfer molding, dam fill encapsulation, and screen print encapsulation. The second mold compound 20 may directly reside over the top surface of the thinned switch die 14. If there is no transitional layer in the thinned switch die 14, the second mold compound 20 may directly reside over the GaN buffer layer 36. In some cases, the second mold compound 20 may further reside over the first mold compound 18. A curing process (not shown) is followed to harden the second mold compound 20. The curing temperature is between 100° C. and 320° C. depending on which material is used as the second mold compound 20. A top surface of the second mold compound 20 may be planarized by a mechanical grinding process (not shown).

Figure 9:
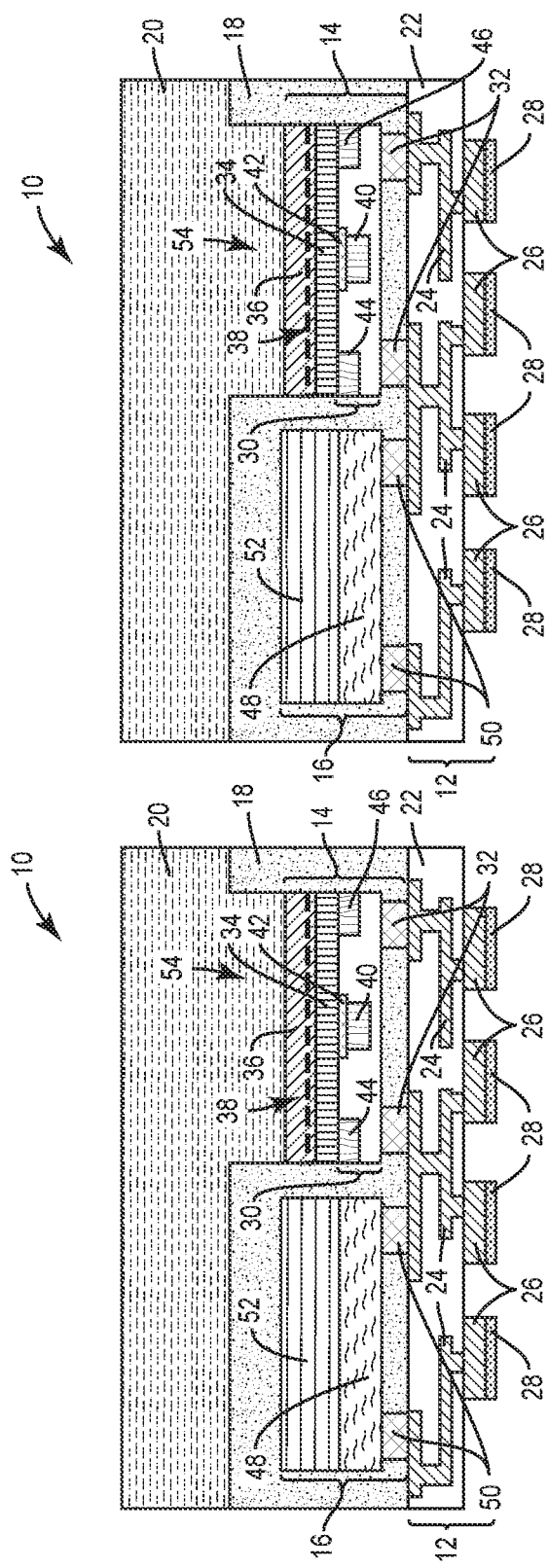

Herein, the GaN based package 68 includes a number of the GaN based modules 10, which share the package substrate 12F, the first mold compound 18, and the second mold compound 20. Lastly, the GaN based package 68 is singulated at each inter-module area 64 to provide individual GaN based modules 10, as illustrated in FIG. 9. Each individual GaN based module at least includes the thinned switch die 14, the CMOS controller die 16 and the module substrate 12.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
a module substrate comprising a substrate body that has a top surface and a bottom surface;
a thinned switch die attached to the top surface of the substrate body and comprising:
an electrode region;
a plurality of switch interconnects extending from a bottom surface of the electrode region to the top surface of the substrate body;
an aluminium gallium nitride (AlGaN) barrier layer over a top surface of the electrode region;
a GaN buffer layer over the AlGaN barrier layer; and
a lateral two-dimensional electron gas (2DEG) layer realized at a heterojunction of the AlGaN barrier layer and the GaN buffer layer; and
a first mold compound residing over the top surface of the substrate body, surrounding the thinned switch die, and extending above a top surface of the thinned switch die to form an opening over the top surface of the thinned switch die; and
a second mold compound filling the opening to encapsulate the thinned switch die.

2. The apparatus of claim 1 further comprises an intact controller die attached to the top surface of the substrate body, wherein:
the intact controller die is configured to control operation of the thinned switch die;
the intact controller die includes a device layer, a plurality of controller interconnects extending from a bottom surface of the device layer to the top surface of the substrate body, and a silicon controller substrate over a top surface of the device layer; and
the first mold compound encapsulates the intact controller die.

3. The apparatus of claim 1 further comprises a third mold compound and an intact controller die, wherein:
the intact controller die is attached to the bottom surface of the substrate body and configured to control operation of the thinned switch die;
the intact controller die includes a device layer, a plurality of controller interconnects extending from a bottom surface of the device layer to the bottom surface of the substrate body, and a silicon controller substrate over a top surface of the device layer; and
the third mold compound resides over the bottom surface of the substrate body and encapsulates the intact controller die.

4. The apparatus of claim 3 wherein the first mold compound and the third mold compound are formed from a same material.

5. The apparatus of claim 3 wherein the module substrate further comprises connecting layers, wherein:
the connecting layers are integrated in the substrate body;
first portions of the connecting layers are exposed at the top surface of the substrate body, and second portions of the connecting layers are exposed at the bottom surface of the substrate body; and
each of the plurality of switch interconnects is electrically coupled to a corresponding first portion of the connecting layers, and each of the plurality of controller interconnects is electrically coupled to a corresponding second portion of the connecting layers.

6. The apparatus of claim 5 further comprises a plurality of external contacts, each of which is electrically coupled to the corresponding second portion of the connecting layers, extends through the third mold compound, and is exposed at a bottom of the third mold compound.

7. The apparatus of claim 1 wherein the second mold compound has an electrical resistivity greater that 1E6 Ohm-cm.

8. The apparatus of claim 1 wherein the second mold compound has a thermal conductivity greater than 2 W/m·K.

9. The apparatus of claim 1 wherein the first mold compound and the second mold compound are formed from different materials.

10. The apparatus of claim 1 wherein the first mold compound is formed from a same material as the second mold compound.

11. The apparatus of claim 1 wherein the second mold compound is in contact with the GaN buffer layer of the thinned switch die.

12. The apparatus of claim 1 wherein the thinned switch die further comprises a transitional layer over the GaN buffer layer and the second mold compound is in contact with the transitional layer.

13. The apparatus of claim 1 wherein the module substrate further comprises connecting layers with first portions and second portions, and a plurality of module contacts, wherein:
the connecting layers are integrated in the substrate body;
the first portions of the connecting layers are exposed at the top surface of the substrate body, and the second portions of the connecting layers are exposed at the bottom surface of the substrate body;
the plurality of module contacts are formed at the bottom surface of the substrate body; and
each of the plurality of switch interconnects is electrically coupled to a corresponding first portion of the connecting layers, and each of the plurality of module contacts is electrically coupled to a corresponding second portion of the connecting layers.

14. The apparatus of claim 1 further comprises a thermally conductive film residing over at least the top surface of the thinned switch die at a bottom of the opening, wherein the second mold compound directly resides over the thermally conductive film and fills the opening.

15. The apparatus of claim 14 wherein the thermally conductive film has a thermal conductivity between 5 w/m·k and 5000 w/m·k.

16. The apparatus of claim 15 wherein the thermally conductive film has a thickness between 0.1 μm and 100 μm.

17. The apparatus of claim 14 wherein the thermally conductive film is formed from one of a group consisting of chemical vapor deposition (CVD) diamond, boron nitride, aluminum nitride, alumina, and beryllium oxide.

18. The apparatus of claim 14 wherein the thermally conductive film has a higher thermal conductivity than the second mold compound.

* * * * *